(12) United States Patent
Corman et al.

(10) Patent No.: US 8,228,232 B2
(45) Date of Patent: Jul. 24, 2012

(54) ACTIVE PHASED ARRAY ARCHITECTURE

(75) Inventors: David W. Corman, Gilbert, AZ (US);
Kenneth V. Buer, Gilbert, AZ (US);
Donald Lawson Runyon, Johns Creek, GA (US); Stefano Vacarro, Gland (CH);
Ferdinando Tiezzi, Renens (CH);
Daniel Llorens del Rio, Lausanne (CH);
Donald E. Crockett, Mesa, AZ (US)

(73) Assignee: ViaSat, Inc., Carlsbad, CA (US)

( * ) Notice: Subject to any disclaimer, the term of this patent is extended or adjusted under 35 U.S.C. 154(b) by 184 days.

(21) Appl. No.: 12/759,130

(22) Filed: Apr. 13, 2010

(65) Prior Publication Data
US 2010/0259445 A1  Oct. 14, 2010

Related U.S. Application Data

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
*H01Q 21/06* (2006.01)

(52) U.S. Cl. .................................................... 342/362

(58) Field of Classification Search .................. 342/362
See application file for complete search history.

(56) References Cited

U.S. PATENT DOCUMENTS

| | | | |
|---|---|---|---|
| 3,119,965 A | 1/1964 | Phillips | |
| 4,857,777 A | 8/1989 | Altes | |
| 4,896,374 A | 1/1990 | Waugh et al. | |
| 4,965,602 A | 10/1990 | Kahrilas et al. | |

(Continued)

FOREIGN PATENT DOCUMENTS

EP  0762660  3/1997

(Continued)

OTHER PUBLICATIONS

International Search Report and Written Opinion dated Jul. 19, 2010, PCT US10/030881, 149 pages.

(Continued)

*Primary Examiner* — Harry Liu
(74) *Attorney, Agent, or Firm* — Snell & Wilmer LLP

(57) ABSTRACT

In an exemplary embodiment, a phased array solid-state architecture has dual-polarized feeds and is manufactured, for example, on highly flexible silicon germanium (SiGe). The implementation of dual-polarized feeds facilitates the operation of phased arrays where the polarization can be statically or dynamically controlled on a subarray or element basis. In an exemplary embodiment, the sub-component control is configured to optimize a performance characteristic associated with polarization, such as phase or amplitude adjustment. An active phased array architecture may replace traditional distributed and GaAs implementations for the necessary functions required to operate electronically steerable phased array antennas. The architecture combines active versions of vector generators, power splitters, power combiners, and RF hybrids in a novel fashion to realize a fully or substantially monolithic solution for a wide range of antenna applications that can be realized with radiating elements having single-polarized or dual-polarized feeds.

22 Claims, 24 Drawing Sheets

U.S. PATENT DOCUMENTS

| | | | |
|---|---|---|---|
| 4,994,773 | A | 2/1991 | Chen et al. |
| 5,045,822 | A | 9/1991 | Mohwinkel |
| 5,270,719 | A | 12/1993 | Roth |
| 5,942,929 | A | 8/1999 | Aparin |
| 5,966,049 | A | 10/1999 | Yuen et al. |
| 6,061,553 | A | 5/2000 | Matsuoka et al. |
| 6,232,837 | B1 | 5/2001 | Yoo et al. |
| 6,326,845 | B1 | 12/2001 | Miyaji et al. |
| 7,319,345 | B2 | 1/2008 | Farjad-rad et al. |
| 7,355,470 | B2 | 4/2008 | Sorrells et al. |
| 7,378,902 | B2 | 5/2008 | Sorrells et al. |
| 7,408,507 | B1 | 8/2008 | Paek et al. |
| 7,420,423 | B2 | 9/2008 | Lee et al. |
| 7,421,036 | B2 | 9/2008 | Sorrells et al. |
| 7,620,129 | B2 | 11/2009 | Sorrells et al. |
| 7,728,784 | B2 | 6/2010 | Mohamadi |
| 7,746,764 | B2 | 6/2010 | Rawlins et al. |
| 7,750,733 | B2 | 7/2010 | Sorrells et al. |
| 7,755,430 | B2 | 7/2010 | Imagawa |
| 7,885,682 | B2 | 2/2011 | Sorrells et al. |
| 2002/0113648 | A1 | 8/2002 | Miyaji et al. |
| 2003/0016085 | A1 | 1/2003 | Yamazaki |
| 2003/0162566 | A1 | 8/2003 | Shapira et al. |
| 2004/0095190 | A1* | 5/2004 | Klaren et al. ............ 330/124 R |
| 2004/0121750 | A1 | 6/2004 | Nation |
| 2004/0229584 | A1 | 11/2004 | Fischer et al. |
| 2005/0113052 | A1 | 5/2005 | Rabinovich |
| 2005/0151698 | A1 | 7/2005 | Mohamidi |
| 2006/0170499 | A1 | 8/2006 | Rahman et al. |
| 2007/0248186 | A1 | 10/2007 | Sorrells et al. |
| 2007/0275674 | A1 | 11/2007 | Chein |
| 2007/0280384 | A1 | 12/2007 | Hidaka |
| 2008/0129408 | A1 | 6/2008 | Nagaishi et al. |
| 2008/0129634 | A1* | 6/2008 | Pera et al. .................... 343/853 |
| 2008/0218424 | A1 | 9/2008 | Blanton |
| 2009/0091384 | A1 | 4/2009 | Sorrells et al. |
| 2010/0073085 | A1 | 3/2010 | Sorrells et al. |
| 2010/0097138 | A1 | 4/2010 | Sorrells et al. |
| 2010/0225389 | A1 | 9/2010 | Teetzel |

FOREIGN PATENT DOCUMENTS

| | | |
|---|---|---|
| EP | 1193861 | 4/2002 |
| JP | 2003168938 | 6/2003 |
| WO | WO9945609 | 8/1999 |
| WO | WO0003456 | 1/2000 |
| WO | WO0241442 | 5/2002 |
| WO | WO03036756 | 5/2003 |

OTHER PUBLICATIONS

International Search Report and Written Opinion dated Aug. 23, 2010,PCT/US2010/30864 12 pages.

Kwang-Jin, Koh, Gabriel M. Rebeiz, 0.13-mu m CMOS phase shifters for X-, Ku, and K-band phased arrays, IEEE Journal of Solid State Circuits, 2007, 14 pages.

Kwang-Jin, Koh, Jason W. May, Gabriel M. Rebeiz A Q-Band (40-45 GHz) 16-Element Phased-Array Transmitter in 0.18-µm SiGe BiCMOS Technology, IEEE Radio Frequency Integrated Circuits Symposium, 2008, 4 pages.

Kwang-Jin, Koh, Gabriel M. Rebeiz, An X- and Ku-Band 8-Element Phased-Array Receiver in 0.18-µm SiGe BiCMOS Technology, IEEE Journal of Solid State Circuits, Jun. 2008, 12 pages.

USPTO; Office Action dated Apr. 7, 2011 in U.S. Appl. No. 12/759,064.

Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.

Ayari et al., "Automatic Test Vector Generation for Mixed-Signal Circuits," 1995, Ecole Polytechnique of the University of Montreal, 6 pages.

Strassberg, Dan, "RF-vector-signal generator combines high throughput, low phase noise," EDN, Oct. 6, 2009, 2 pages, UBM Electronics.

International Preliminary Report on Patentability dated Jul. 21, 2011 from PCT/US2010/030877.

International Preliminary Report on Patentability dated Jul. 21, 2011 from PCT/US10/30906.

International Preliminary Report on Patentability dated Jul. 21, 2011 from PCT/US10/30892.

Office Action dated Sep. 29, 2011 from U.S. Appl. No. 12/759,059.

Office Action dated Jan. 4, 2012 from U.S. Appl. No. 12/759,148.

Notice of Allowance dated Jul. 27, 2011 in U.S. Appl. No. 12/759,064.

International Preliminary Report dated Oct. 27, 2011 from PCT/US10/030864.

International Preliminary Report dated Oct. 27, 2011 from PCT/US10/30868.

International Preliminary Report dated Oct. 27, 2011 from PCT/US10/030881.

International Preliminary Report dated Oct. 27, 2011 from PCT/US10/30872.

International Preliminary Report dated Oct. 27, 2011 from PCT/US10/30871.

International Preliminary Report dated Oct. 27, 2011 from PCT/US10/30866.

International Preliminary Report dated Oct. 27, 2011 from PCT/US10/030876.

International Search Report and Written Opinion dated Oct. 27, 2010, PCT/US10/030876, 8 pages.

International Search Report and Written Opinion dated Nov. 18, 2010, PCT/US10/30871, 10 pages.

International Search Report and Written Opinion dated Nov. 26, 2010, PCT/US10/30868, 10 pages.

International Search Report and Written Opinion dated Nov. 26, 2010, PCT/US10/30877, 10 pages.

Tokumitsu et al.—Active isolator, combiner, divider and magic-T as miniaturized function blocks dated Nov. 6, 1998.

International Search Report and Written Opinion dated Nov. 26, 2010, PCT/US10/30866, 8 pages.

Aminghasem Safarian et al., Distributed Active Power Combiners and Splitters for Multi-Antenna UWB.

Viallon et al. An Original SiGe Active Differential Output Power Splitter for Millimetre-wave Applications, 2003.

International Search Report and Written Opinion dated Nov. 26, 2010, PCT/US10/30892, 9 pages.

International Search Report and Written Opinion dated Nov. 26, 2010, PCT/US10/30872, 9 pages.

Hsiao Analysis of Interleaved Arrays of Nov. 1971.

International Search Report and Written Opinion dated Nov. 30, 2010, PCT/US10/30906, 11 pages.

Notice of Allowance dated Feb. 28, 2012 in U.S. Appl. No. 12/759,059.

Office Action dated May 7, 2012 in U.S. Appl. No. 12/759,113.

Office Action dated May 17, 2012 in U.S. Appl. No. 12/79,043.

* cited by examiner

ACTIVE PHASED ARRAY ARCHITECTURE

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND OF THE INVENTION

A phased array antenna uses multiple radiating elements to transmit, receive, or transmit and receive radio frequency (RF) signals. Phase shifters are used in a phased array antenna in order to steer the beam of the signals by controlling the respective phases of the RF signals communicated through the phase shifters. Phased array antennas are used in various capacities, including communications on the move (COTM) antennas, satellite communication (SATCOM) airborne terminals, SATCOM mobile communications, and SATCOM earth terminals. The application of mobile terminals typically requires the use of automatic tracking antennas that are able to steer the beam in azimuth, elevation, and polarization to follow the satellite's position while the terminal is in motion. Moreover, a phased array antenna is typically desired to be "low-profile", small and lightweight, thereby fulfilling the stringent aerodynamic and mass constraints encountered in the typical mounting.

One well known type of phased array antenna is an electronically steerable phased array antenna. The electronically steerable phased array antenna has full electronic steering capability and is more compact and lower profile than a comparable mechanically steered antenna. The main drawback of fully electronic steering is that the antenna usually requires the integration of numerous expensive analog RF electronic components which may prohibitively raise the cost for commercial applications.

In a typical prior art embodiment, a phased array antenna comprises a radiating element that communicates dual linear signals to a hybrid coupler with either a 90° or a 180° phase shift and then through low noise amplifiers (LNA). Furthermore, the dual linear signals are adjusted by phase shifters before passing through a power combiner.

In the prior art, a typical digital phase shifter uses a switched delay line that is physically large and operates over a narrow band of frequencies due to its distributed nature. Another typical digital phase shifter implements a switched high-pass low-pass filter architecture, which has better operating bandwidth compared to a switched delay line but is still physically large. Also, the phase shifter is often made on gallium arsenide (GaAs). Though other materials may be used, GaAs is a higher quality material designed and controlled to provide good performance of electronic devices. However, in addition to being a higher quality material than other possible materials, GaAs is also more expensive and more difficult to manufacture. The typical phased array components take up a lot of area on the GaAs, resulting in higher costs. Furthermore, a standard phase shifter has high RF power loss, which is typically about n+1 dB of loss, where n is the number of phase bits in the phase shifter. Another prior art embodiment uses RF MEMS switches and has lower power loss but still consumes similar space and is generally incompatible with monolithic solutions. Furthermore, the typical components in a phased array antenna are distributed components that are frequency sensitive and designed for specific frequency bands.

Quadrature hybrids or other differential phase generating hybrids are used in a variety of RF applications, including phased array antennas. For example, quadrature hybrids are used for generating circular polarization signals, power combining, or power splitting. Generally, the outputs of a quadrature hybrid have equal amplitude and a 90° phase difference. The quadrature hybrid is often implemented as a distributed structure, such as a Lange coupler, a branchline coupler, or a ring hybrid. Other RF hybrids, such as a magic tee or a ring hybrid, result in 180° phase shift. In general, an RF hybrid uses distributed components, limited in frequency band and requires significant physical space inversely proportional to an operating frequency. Moreover, the quadrature hybrid is typically made of GaAs and has associated RF power loss on the order of 3-4 dB per hybrid when used as a power splitter.

An in-phase hybrid may be configured as a power combiner or power splitter in a variety of RF applications, including phased array antennas. In an exemplary embodiment, the outputs of an in-phase hybrid have equal amplitude and a substantially zero differential phase difference. In another exemplary embodiment, the inputs of an in-phase hybrid configured as a power combiner encounter substantially zero differential phase and amplitude summation of the two input signals. In a typical embodiment of a power combiner, the in-phase hybrid is implemented as a distributed structure such as a Wilkinson hybrid. In general, an in-phase hybrid is limited in frequency band and requires significant physical space that is inversely proportional to the operating frequency. Like the quadrature hybrid, the in-phase hybrid is typically made on GaAs. Moreover, the in-phase hybrid generally has associated RF power loss on the order of 3-4 dB per hybrid when used as a power splitter and an associated RF power loss of about 1 dB when used as a power combiner.

Thus, a need exists for a phased array antenna architecture that is not frequency limited or polarization specific. Furthermore, the antenna architecture should be able to be manufactured on a variety of materials and with little or no associated RF power loss. Also, a need exists for a phased array antenna that uses less space than a similar capability prior art architecture, and is suitable for a monolithic implementation.

SUMMARY

In an exemplary embodiment, a phased array solid-state architecture has dual-polarized feeds and is manufactured, for example, on highly flexible silicon germanium (SiGe). The implementation of dual-polarized feeds facilitates the operation of phased arrays where the polarization can be statically or dynamically controlled on a subarray or element basis. In an exemplary embodiment, the sub-component control is configured to optimize a performance characteristic associated with polarization, such as phase or amplitude adjustment.

An active phased array architecture may replace traditional distributed and GaAs implementations for the necessary functions required to operate electronically steerable phased array antennas. The architecture combines active versions of vector generators, power splitters, power combiners, and RF hybrids in a novel fashion to realize a fully or substantially monolithic solution for a wide range of antenna applications that can be realized with radiating elements having single-polarized or dual-polarized feeds.

In accordance with an exemplary embodiment, a phased array antenna is in communication with a radiating element, and the phased array antenna comprises a 90° hybrid configured to receive dual linearly polarized RF signals from the radiating element, a first vector generator, and a second vector generator. The 90° hybrid is configured to inject a 90° phase shift and generate a RHCP intermediate signal and a LHCP intermediate signal. The first vector generator is configured to receive the RHCP intermediate signal, phase adjust the RCHP intermediate signal for beam steering, and output a first RF signal. The second vector generator configured to receive the LHCP intermediate signal, phase adjust the LCHP intermediate signal for beam steering, and output a second RF signal.

In an exemplary embodiment, a phased array antenna is in communication with a radiating element, and the phased array antenna comprises a first vector generator, a second vector generator, and a hybrid. The first vector generator is configured to receive a first signal from the radiating element, provide phase and amplitude adjustment of the first signal for polarization tracking and beam steering, and output a first intermediate signal. The second vector generator is configured to receive a second signal from the radiating element, provide phase and amplitude adjustment of the second signal for polarization tracking and beam steering, and output a second intermediate signal. The hybrid is configured to receive the first intermediate signal and the second intermediate signal and generate two RF output signals with a phase difference. Furthermore, the two RF output signals are each a composite of the first intermediate signal and the second intermediate signal.

In another exemplary embodiment, a phased array antenna is in communication with a radiating element, and the phased array antenna comprises a first vector generator, a second vector generator, and a combiner. The first vector generator is configured to receive a first signal from the radiating element, provide phase and amplitude adjustment of the first signal for polarization tracking and beam steering, and to output a first intermediate signal. The second vector generator is configured to receive a second signal from the radiating element, provide phase and amplitude adjustment of the second signal for polarization tracking and beam steering, and to output a second intermediate signal. The combiner is configured to receive the first intermediate signal and the second intermediate signal, and combine the two signals into an RF output signal.

In yet another exemplary embodiment, a phased array antenna is in communication with a radiating element, and the phased array antenna comprises a hybrid, a first vector generator, a second vector generator, and a combiner. The hybrid is configured to receive dual linearly polarized RF signals from the radiating element, inject a phase shift, and generate a RHCP intermediate signal and a LHCP intermediate signal. The first vector generator is configured to receive the RHCP intermediate signal, phase adjust the RCHP intermediate signal for beam steering, and output a first RF intermediate signal. The second vector generator is configured to receive the LHCP intermediate signal, phase adjust the LCHP intermediate signal for beam steering, and output a second RF intermediate signal. Furthermore, in the exemplary embodiment, the combiner is configured to receive the first RF intermediate signal and the second RF intermediate signal, and combine the two signals into an RF output signal.

Furthermore, in an exemplary embodiment, a phased array antenna is in communication with a radiating element, and the phased array antenna comprises a hybrid, a first vector generator, a second vector generator, and an output hybrid. The hybrid is configured to receive dual linearly polarized RF signals from the radiating element, inject a phase shift, and generate a RHCP intermediate signal and a LHCP intermediate signal. The first vector generator is configured to receive the RHCP intermediate signal, phase adjust the RCHP intermediate signal for beam steering, and output a first RF intermediate signal. The second vector generator is configured to receive the LHCP intermediate signal, phase adjust the LCHP intermediate signal for beam steering, and output a second RF intermediate signal. Furthermore, the output hybrid is configured to receive the first RF intermediate signal and the second RF intermediate signal and generate two RF output signals with a phase difference. The two RF output signals are a composite of the first and second RF intermediate signals.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

A phased array antenna generally comprises multiple radiating elements, with each radiating element having a polarization component. In an exemplary embodiment, the radiating element has spatially orthogonal linear polarizations, spatially and electrically orthogonal circular polarizations, or spatially orthogonal and electrically non-orthogonal elliptical polarizations.

The polarization component of each radiating element may have one or more signals fed to the ports. In an exemplary embodiment, each radiating element has two feed ports and results in an unbalanced feed system. In yet another exemplary embodiment, each radiating element has three feed ports and results in a partially balanced feed system. In another exemplary embodiment, each radiating element has four feed ports and results in a fully balanced feed system.

In an exemplary embodiment, a phased array antenna with two feed ports is configured to generate and control different polarizations. Exemplary polarization states include a single circular polarization state, a single elliptical polarization state, a single linear polarization state, and two orthogonal polarization states.

The radiating elements may be in communication with an RF integrated circuit (RFIC). In an exemplary embodiment, the RFIC is configured to divide, alter, and re-mix the component RF signal to produce or detect various polarization states. For receiver applications, the RF signal corresponding to the detected polarization state in the RFIC may additionally be combined in a beam-forming network of the array. Conversely, for transmitter applications, the RFIC can receive input signals from a beam-forming network of the array and produce any desired polarization state.

In an exemplary embodiment, a phased array antenna comprises various components. The various components may include a vector generator, an active power splitter, an active power combiner, an active RF hybrid, or the like.

Figure 1:
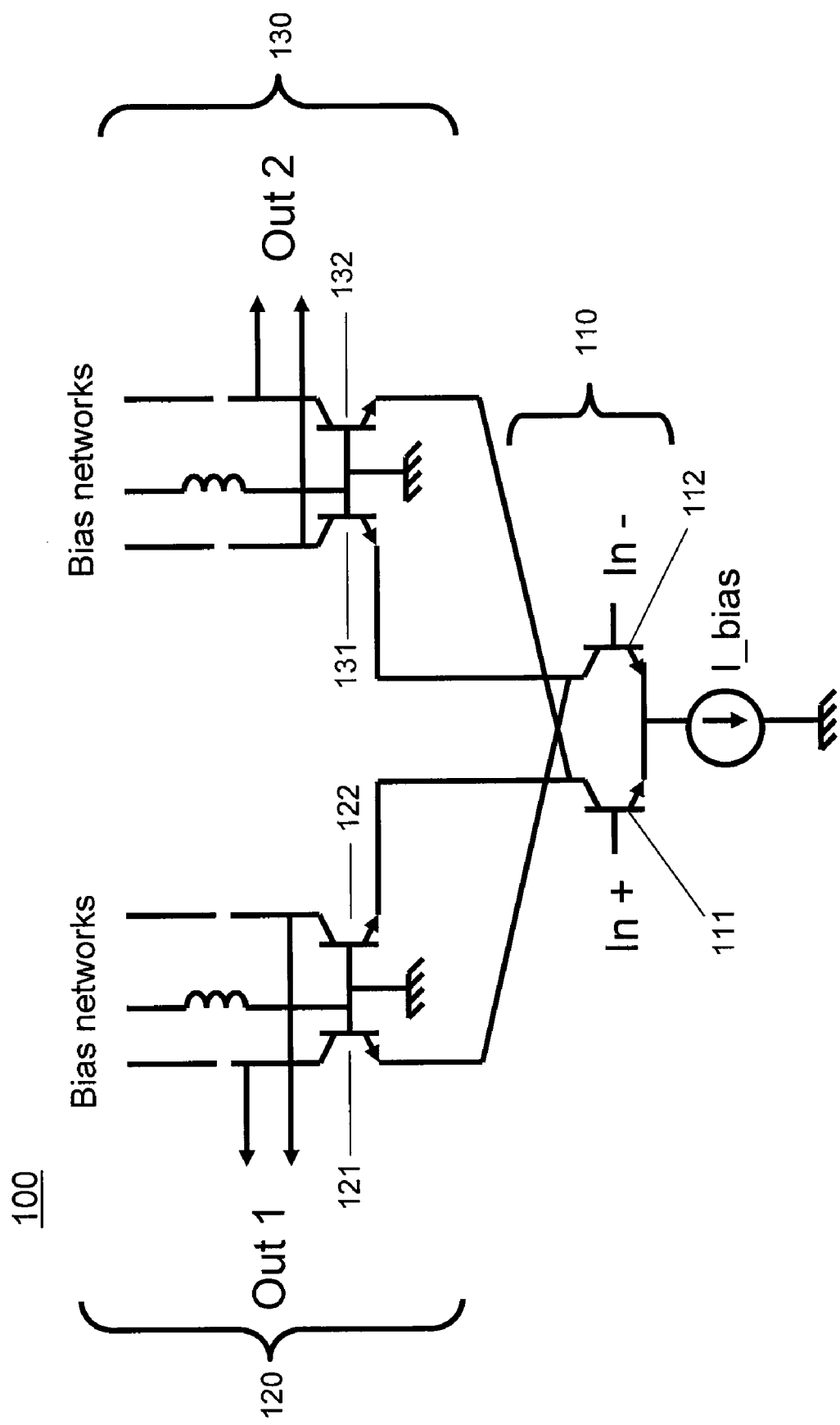
FIG. 1 illustrates an exemplary embodiment of an active power splitter.

Active Splitter: FIG. 1 illustrates a schematic of an exemplary active power splitter. In an exemplary embodiment, an active power splitter 100 comprises a differential input subcircuit 110, a first differential output subcircuit 120, and a second differential output subcircuit 130. The differential input subcircuit 110 has paired transistors 111, 112 with a common emitter node and is constant current biased, as is typical in a differential amplifier. An input signal is communicated to the base of paired transistors 111, 112 in the differential input subcircuit 110. Both the first and second differential output subcircuits 120, 130 comprise a pair of transistors with a common base node and each common base is connected to ground.

The first differential output subcircuit 120 has a first transistor 121 emitter connected to the collector of one of the input subcircuit transistors 112. The emitter of the second output subcircuit transistor 122 is connected to the collector of the other input subcircuit transistor 111. In the exemplary embodiment, the first output is drawn from the collectors of transistors 121, 122 of the first differential output subcircuit 120. Furthermore, the second differential output subcircuit 130 is similarly connected, except the transistor 131, 132 emitters are inversely connected to the input subcircuit transistor 111, 112 collectors with respect to transistors 121, 122.

By inverting the input subcircuit transistor collector connections between the first and second differential output subcircuits, the first output and the second output are approximately 180° out of phase with each other. In another exemplary embodiment, transistor 131, 132 emitters are non-inversely connected to input subcircuit transistor 111, 112 collectors, causing the first output and the second output to be approximately in phase with each other. In general, the absolute phase shift of the output signals through the power splitter is not as important as the relative phasing between the first and second output signals.

In an exemplary embodiment, active power splitter 100 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 100, can provide gain and the relative power level between the input signal and the output signal is adjustable and can be selectively designed. In an exemplary embodiment, the output signal is configured to achieve a substantially neutral or positive power gain over the input signal. For example, the output signal may achieve a 3 dB signal power gain over the input signal. In an exemplary embodiment, the output signal may achieve a power gain in the 0 dB to 5 dB range. Moreover, the output signal may be configured to achieve any suitable power gain.

In accordance with an exemplary embodiment, active power splitter 100 produces output signals with a differential phase between the two signals that is zero or substantially zero. The absolute phase shift of output signals through the active power splitter may not be as important as the differential phasing between the output signals.

In another exemplary embodiment, active power splitter 100 additionally provides matched impedances at the input and output ports. The matched impedances may be 50 ohms, 75 ohms, or other suitable impedances. Furthermore, in an exemplary embodiment, active splitter 100 provides isolation between the output ports of the active power splitter. In one exemplary embodiment, active power splitter 100 is manufactured as a MMIC with a compact size that is independent of the operating frequency due to a lack of distributed components.

Figure 2:
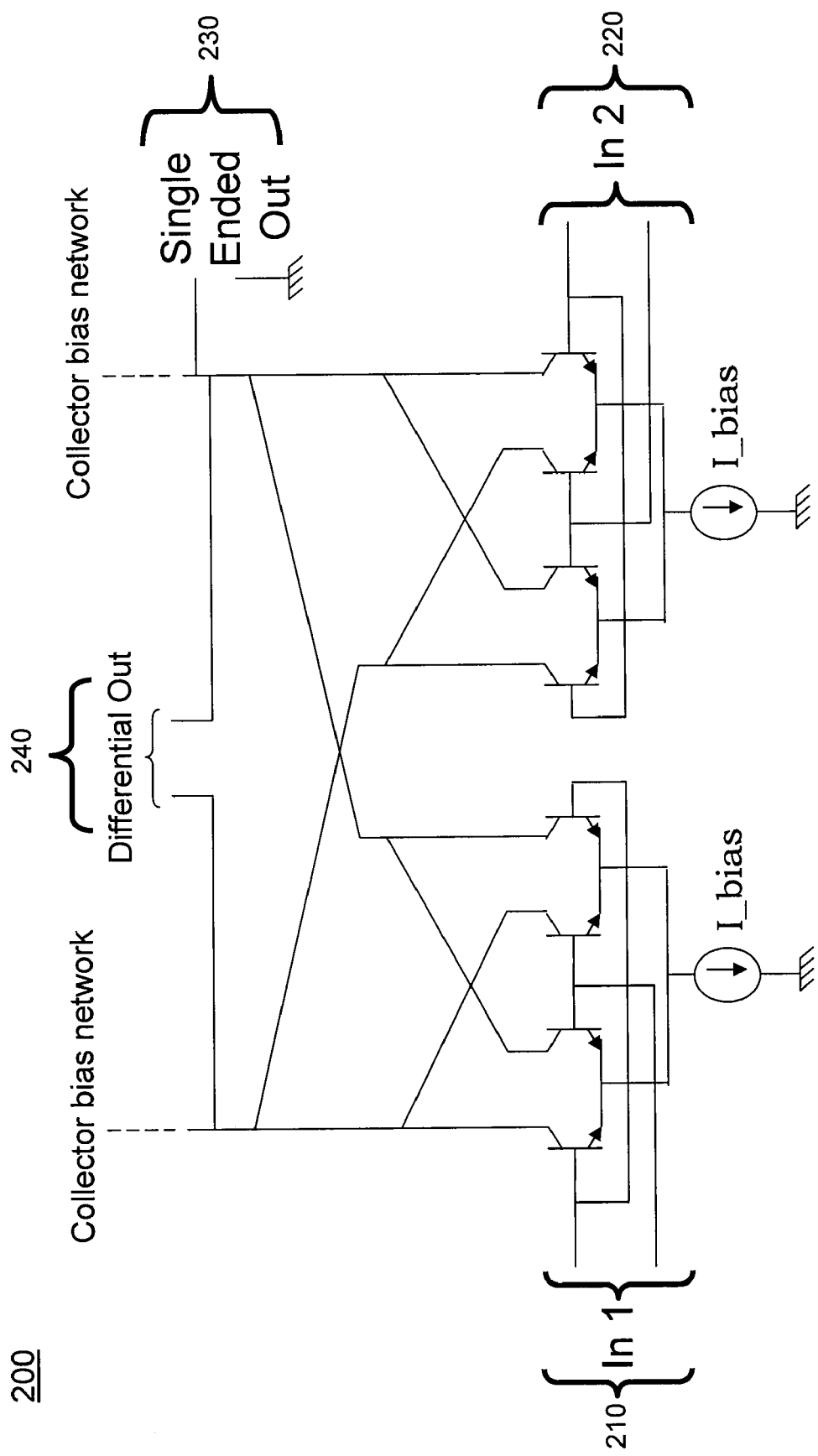
FIG. 2 illustrates an exemplary embodiment of an active power combiner.

Active Combiner: In an exemplary embodiment and with reference to FIG. 2, an active power combiner 200 comprises a first differential input subcircuit 210, a second differential input subcircuit 220, a single ended output subcircuit 230, and a differential output subcircuit 240. Each differential input subcircuit 210, 220 includes two pairs of transistors, with each transistor of each differential input subcircuit 210, 220 having a common emitter node with constant current biasing, as is typical in a differential amplifier.

A first input signal is communicated to the bases of the transistors in first differential input subcircuit 210. For example, a first line of input signal In1 is provided to one transistor of each transistor pair in first differential input subcircuit 210, and a second line of input signal In1 is provided to the other transistor of each transistor pair. Similarly, a second input signal is communicated to the bases of the transistors in second differential input subcircuit 220. For example, a first line of input signal In2 is provided to one transistor of each transistor pair in first differential input subcircuit 220, and a second line of input signal In2 is provided to the other transistor of each transistor pair. Furthermore, in an exemplary embodiment, a differential output signal is formed by a combination of signals from collectors of transistors in first and second differential input subcircuits 210, 220.

In an exemplary embodiment, active power combiner 200 converts two input RF signals into a single output signal. The output signal can either be a single ended output at single ended output subcircuit 230, or a differential output at differential output subcircuit 240. In other words, active power combiner 200 performs a function that is the inverse of active power splitter 100. The input signal levels can be of arbitrary amplitude and phase. Similar to an active power splitter, active power combiner 200 can provide gain and the relative power level between the inputs and output is also adjustable and can be selectively designed. In an exemplary embodiment, the output signal achieves a substantially neutral or positive signal power gain over the input signal. For example, the output signal may achieve a 3 dB power gain over the sum of the input signals. In an exemplary embodiment, the output signal may achieve a power gain in the 0 dB to 5 dB range. Moreover, the output signal may achieve any suitable power gain.

In an exemplary embodiment, active power combiner 200 additionally provides matched impedances at the input and output ports. The matched impedances may be 50 ohms, 75 ohms, or other suitable impedances. Furthermore, in an exemplary embodiment, active power combiner 200 provides isolation between the input ports of the power combiner.

In yet another exemplary embodiment, the active power combiner 200 implements identical building block components as used in an exemplary active phased array architecture. In one exemplary embodiment, the active power combiner 200 is manufactured as a MMIC with a compact size that is independent of the operating frequency due to a lack of distributed components. Throughout, the active power combiner described in various exemplary embodiments may be similar to the active power combiner described with reference to FIGS. 6, 8-9, and 12-13.

Figure 3:
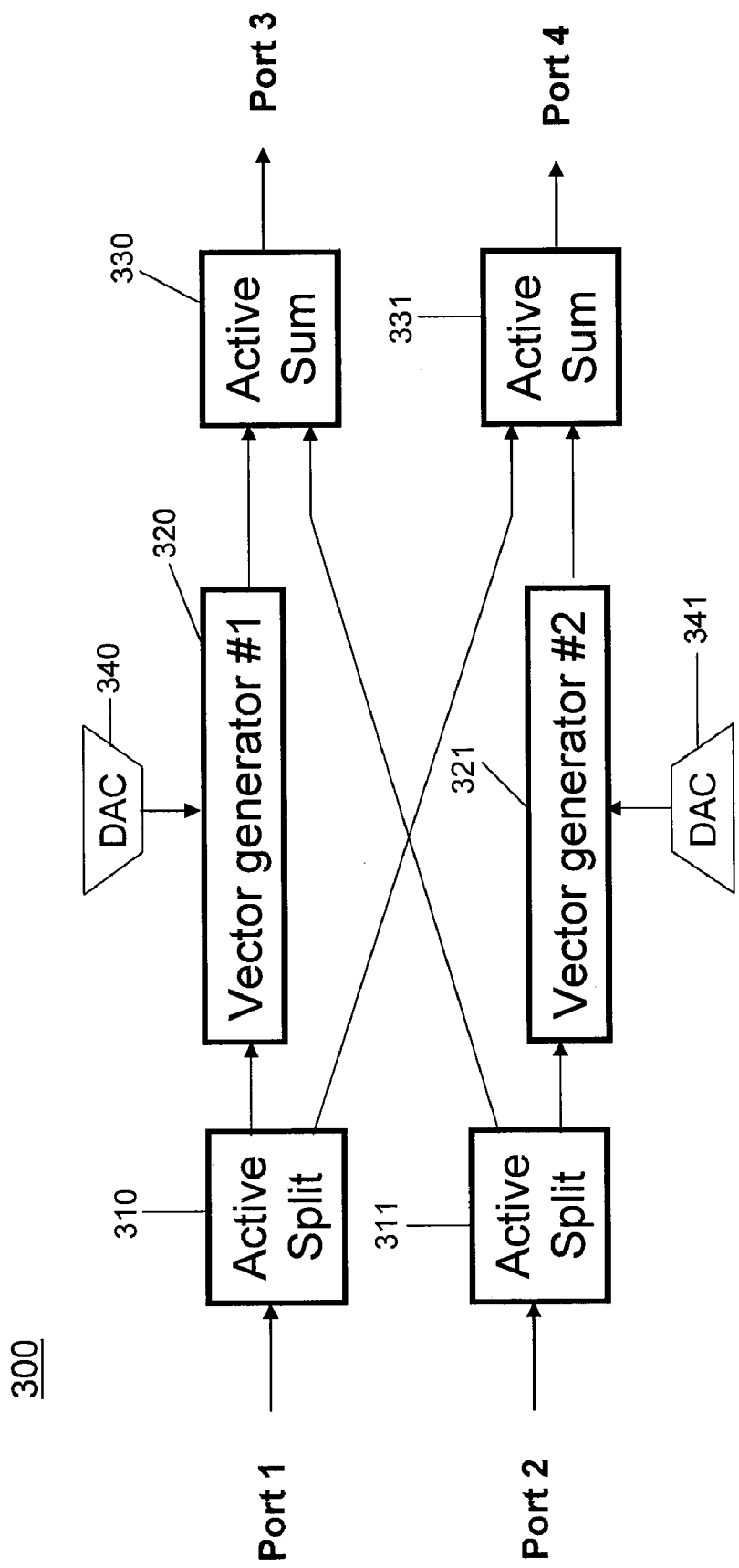
FIG. 3 illustrates an exemplary embodiment of an active RF hybrid.

Active RF Hybrid: In an exemplary embodiment, and with reference to FIG. 3, an active RF hybrid 300 comprises a first active power splitter 310, a second active power splitter 311, a first vector generator 320, a second vector generator 321, a first active power combiner 330, a second active power combiner 331, a first digital-to-analog converter (DAC) 340 and a second DAC 341. In accordance with the exemplary embodiment, first active power splitter 310 receives an input at Port 1 and communicates the input to first vector generator 320 and second active power combiner 331. Likewise, second active power splitter 311 receives an input at Port 2 and communicates the input to second vector generator 321 and first active power combiner 330. Vector generators 320, 321 are controlled in part by respective DACs 340, 341. In an exemplary embodiment, a 4-bit DAC is used but any number of bits many be used.

Furthermore, the output of first vector generator 320 is communicated to first active power combiner 330, and the output of second vector generator 321 is communicated to second active power combiner 331. In the exemplary embodiment, first active power combiner 330 receives input from first vector generator 320 and second active power splitter 311, and outputs a signal to Port 3. Similarly, second active power combiner 331 receives input from second vector generator 321 and first active power splitter 310, and outputs a signal to Port 4.

Active RF hybrid 300 may be used to replace various distributed components, such as a branchline coupler, Lange coupler, directional coupler, or 180° hybrid. In accordance with an exemplary embodiment, an active RF hybrid provides similar functionality in comparison to a traditional distributed hybrid. For example, active RF hybrid 300 may be dynamically configured to have variable phase differences between the output ports, which could be 90°, 180°, or some other phase difference. Another example is that active RF hybrid 300 provides port-to-port isolation and matched impedances at the input/output ports. Additional information regarding active RF hybrids is disclosed in the U.S. patent application Ser. No. 12/759,043, entitled "ACTIVE HYBRIDS FOR ANTENNA SYSTEMS", filed the same day as this application is hereby incorporated by reference.

Furthermore, the active RF hybrid 300 has various advantages over a traditional passive distributed hybrid. In an exemplary embodiment, the active RF hybrid 300 does not result in a loss of power, but instead has a gain or is at least gain neutral. In another exemplary embodiment, the active RF hybrid 300 does not rely on distributed elements and is capable of operating over very wide bandwidths. In yet another exemplary embodiment, the active RF hybrid 300 implements identical building block components as used in an exemplary active phased array architecture. In one exemplary embodiment, the active RF hybrid 300 is manufactured as a MMIC with a compact size that is independent of the operating frequency due to a lack of distributed components.

Throughout, the active RF hybrid described in various exemplary embodiments may be similar to the active RF hybrid described with reference to FIGS. 8-11, 16, 18-20, and 22.

Vector Generator: In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signals from the current summer are modulated in at least one of amplitude and phase.

Figure 4:
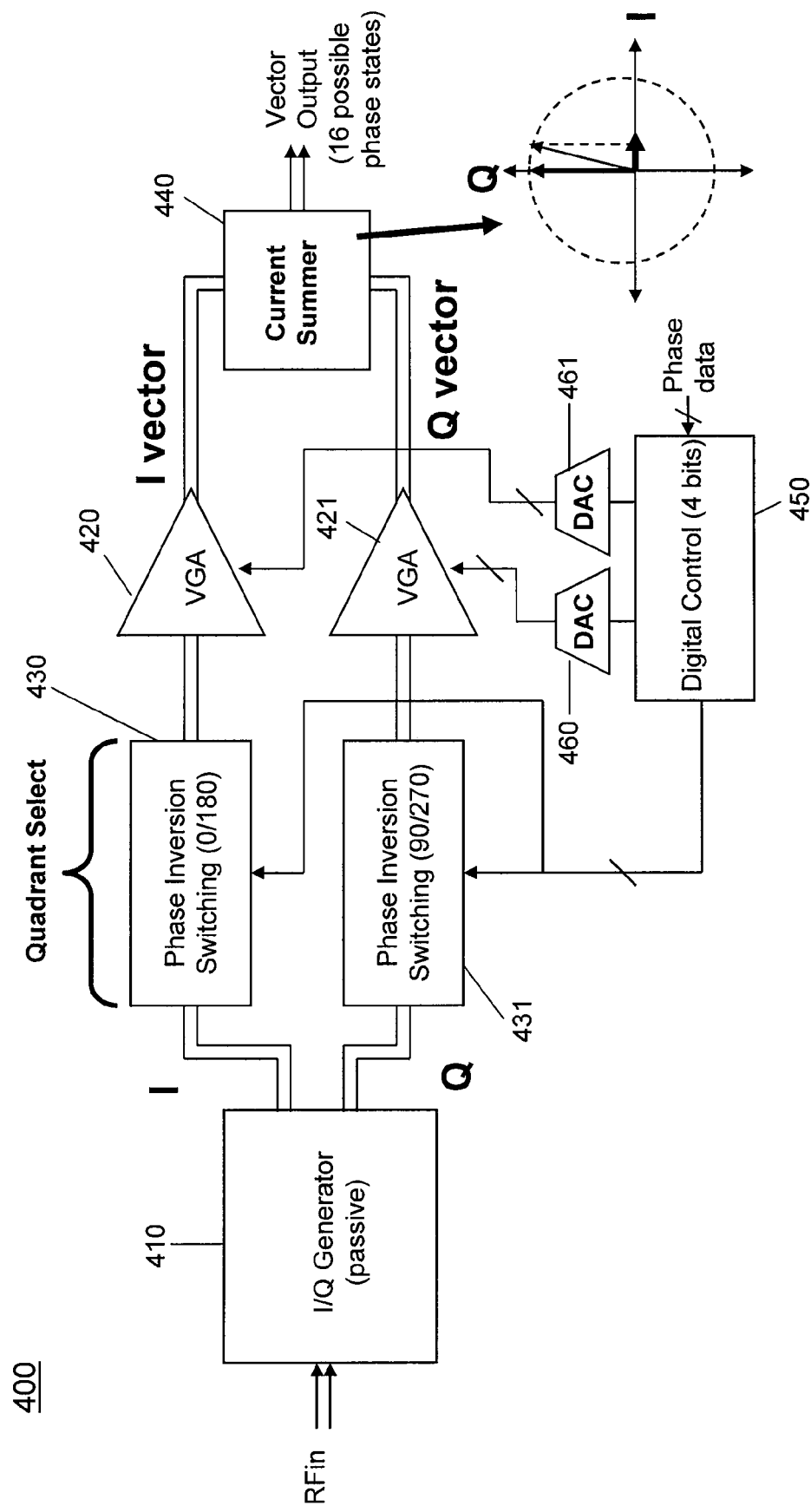
FIG. 4 illustrates an exemplary embodiment of an active vector generator.

In accordance with an exemplary embodiment and with reference to FIG. 4, a vector generator 400 comprises a passive I/Q generator 410, a first variable gain amplifier (VGA) 420 and a second VGA 421, a first quadrant select 430 and a second quadrant select 431 each configured for phase inversion switching, and a current summer 440. The first quadrant select 430 is in communication with I/Q generator 410 and first VGA 420. The second quadrant select 431 is in communication with I/Q generator 410 and second VGA 421. Furthermore, in an exemplary embodiment, vector generator 400 comprises a digital controller 450 that controls a first digital-to-analog converter (DAC) 460 and a second DAC 461. The first and second DACs 460, 461 control first and second VGAs 421, 420, respectively. Additionally, digital controller 450 controls first and second quadrant selects 430, 431.

In an exemplary embodiment, vector generator 400 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 400 or limited to various portions of vector generator 400. In another exemplary embodiment, the RF signals are communicated non-differentially. The I vector and Q vector are processed in parallel, each passing through the phase inverting switching performed by first and second quadrant selects 430, 431. The resultant outputs of the phase inverting switches comprise four possible signals: a non-inverted I, an inverted I, a non-inverted Q, and an inverted Q. In this manner, all four quadrants of a phasor diagram are available for further processing by VGAs 420, 421. In an exemplary embodiment, two of the four possible signals non-inverted I, inverted I, non-inverted Q, and inverted Q are processed respectively through VGAs 420, 421, until the two selected signals are combined in current summer 440 to form a composite RF signal. The current summer 440 outputs the composite RF signal with phase and amplitude adjustments. In an exemplary embodiment, the composite RF signal is in differential signal form. In another exemplary embodiment, the composite RF signals are in single-ended form.

In an exemplary embodiment, control for the quadrant shifting and VGA functions is provided by a pair of DACs. In an exemplary embodiment, reconfiguration of digital controller 450 allows the number of phase bits to be digitally controlled after vector generator 400 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 460, 461 can be made after vector generator 400 is fabricated in order to facilitate adjustment of the vector amplitudes.

Phased Array Architectures

In accordance with an exemplary embodiment, a phased array antenna comprises active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the distributed/passive network in the prior art, including lower cost, smaller physical size that is independent of operating frequency, wider operating bandwidths, and the ability to provide power gain rather than a power loss.

Additionally, other advantages over the prior art embodiments are possible, depending on the phased array architecture. Some of the advantages include extensive system flexibility and very compact antenna systems because no distributed structures are required. Furthermore, some embodiments employ differential signaling to improve signal isolation when the RF signal is in analog form.

Some of the main advantages include that RF signals undergo a neutral or slight positive power gain when being communicated through the antenna system, rather than power losses that occur in the passive prior art systems. Another advantage is that the antenna system is not band limited. In other words, the antenna system is applicable to all frequency bands, including X, K, Ku, Ka, and Q bands. In an exemplary embodiment, the antenna system operates over specific frequency ranges, such as 2-20 GHz, 20-40 GHz, or 30-45 GHz. In an exemplary embodiment, multi-band antennas are a practical option as a product.

Reconfigurability of the antenna system is also an advantage. In an exemplary embodiment, the antenna system includes the ability to reconfigure the number of phase bits in a DAC over full product life. In another exemplary embodiment, the antenna system is able to reconfigure the amplitude taper of the system over full product life. In yet another exemplary embodiment, the antenna system is able to reconfigure the system polarization over full product life. In an exemplary embodiment with adequate DAC resolution and AGC dynamic range, any arbitrary vector phase and amplitude can be produced with arbitrarily fine quantization steps using digital control.

Throughout, the vector generator described in various exemplary embodiments may be similar to the vector generator described with reference to FIGS. 5-24.

Active Antenna Polarizer: In accordance with an exemplary embodiment, an active antenna polarizer comprises a monolithic, digitally controlled active implementation for processing an RF signal. Two output RF signals communicate with a single radiating element and are digitally controlled to provide any desired polarization phase or amplitude to the radiating element. In an exemplary embodiment, the active antenna polarizer comprises active components and results in no power loss in the communicated signals. Furthermore, in another exemplary embodiment, the active antenna polarizer is configured to operate over multiple frequency bands.

Figure 5:
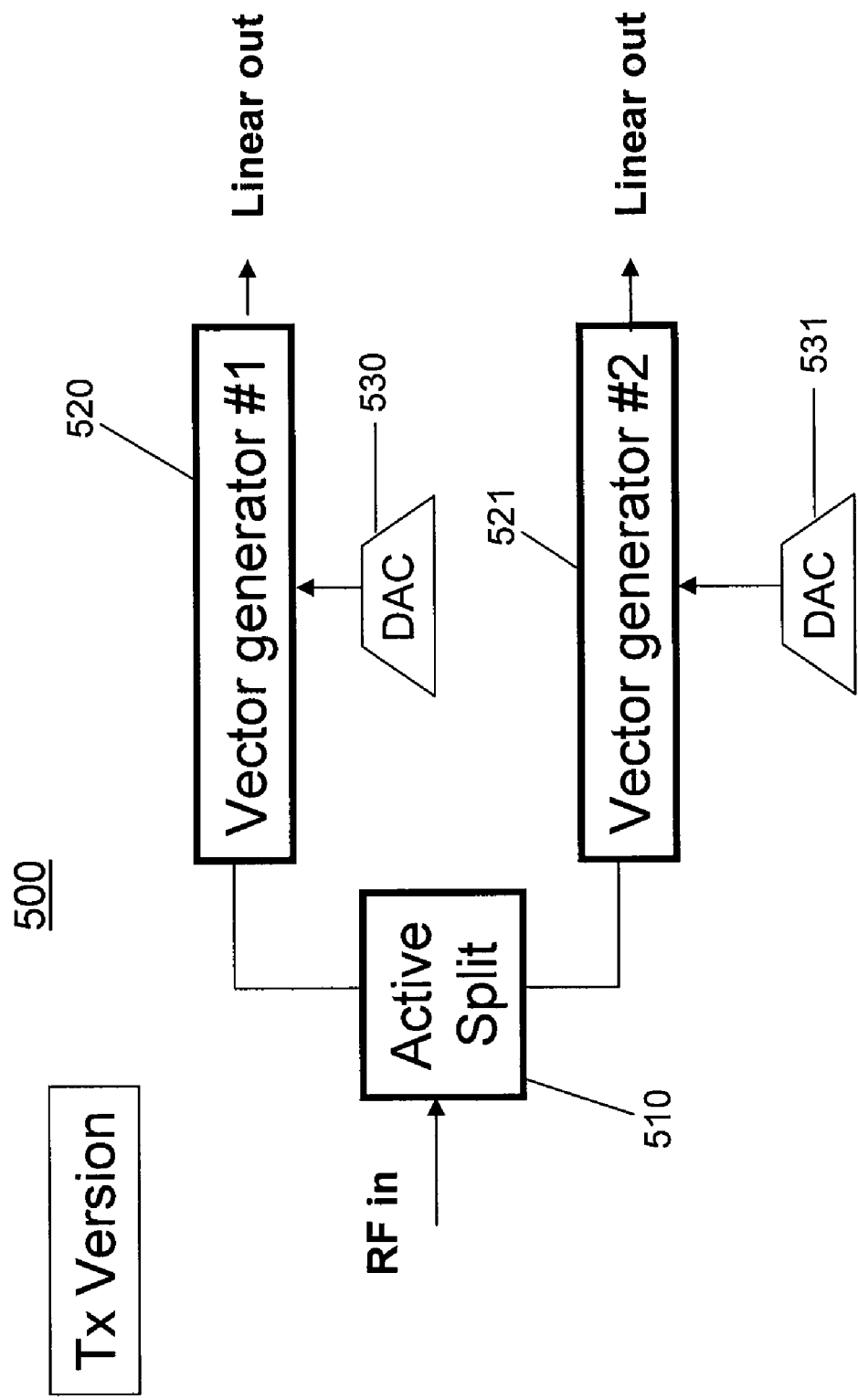
FIG. 5 illustrates an exemplary embodiment of an active antenna signal polarizer.
Figure 6:
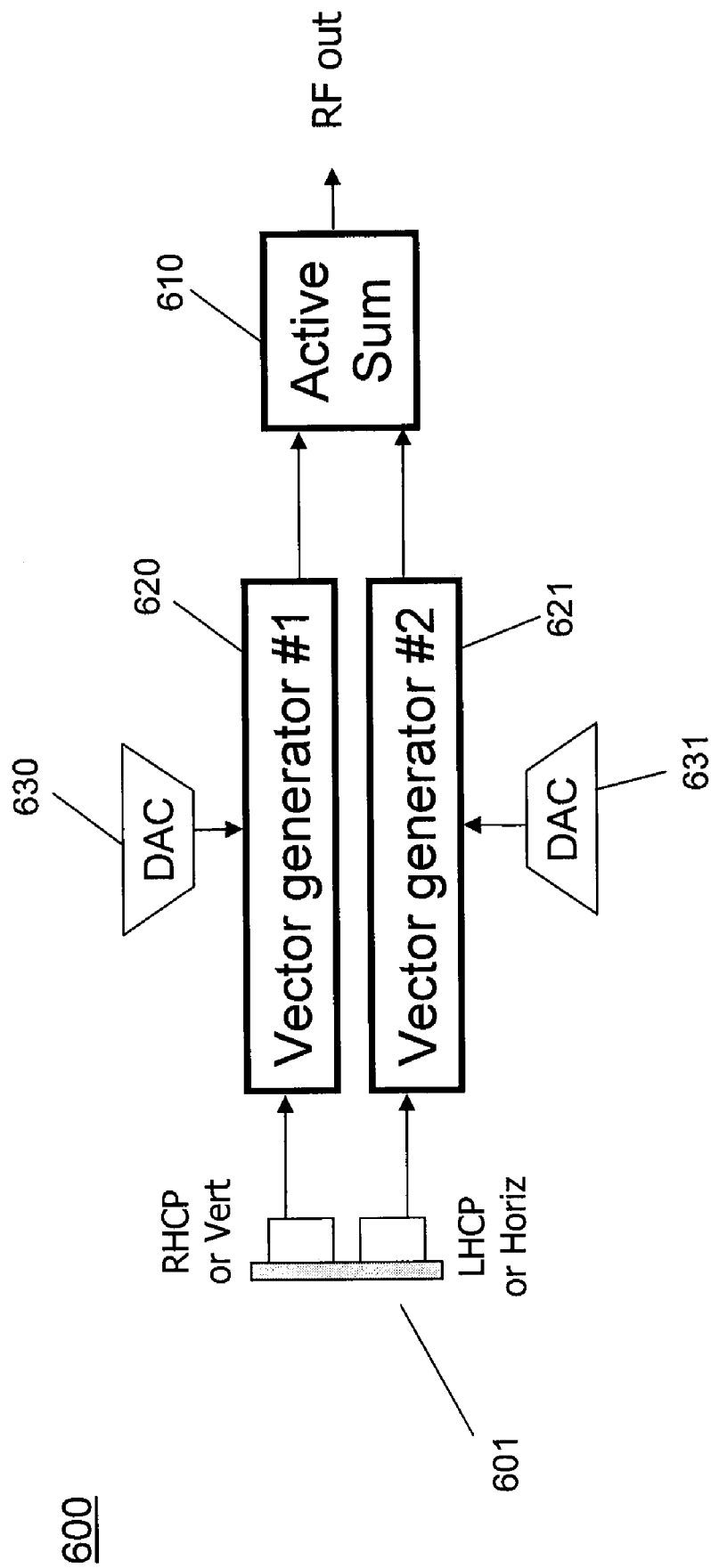
FIG. 6 illustrates an exemplary embodiment of a phased array antenna comprising an active combiner and configured for phase adjustment.
Figure 7:
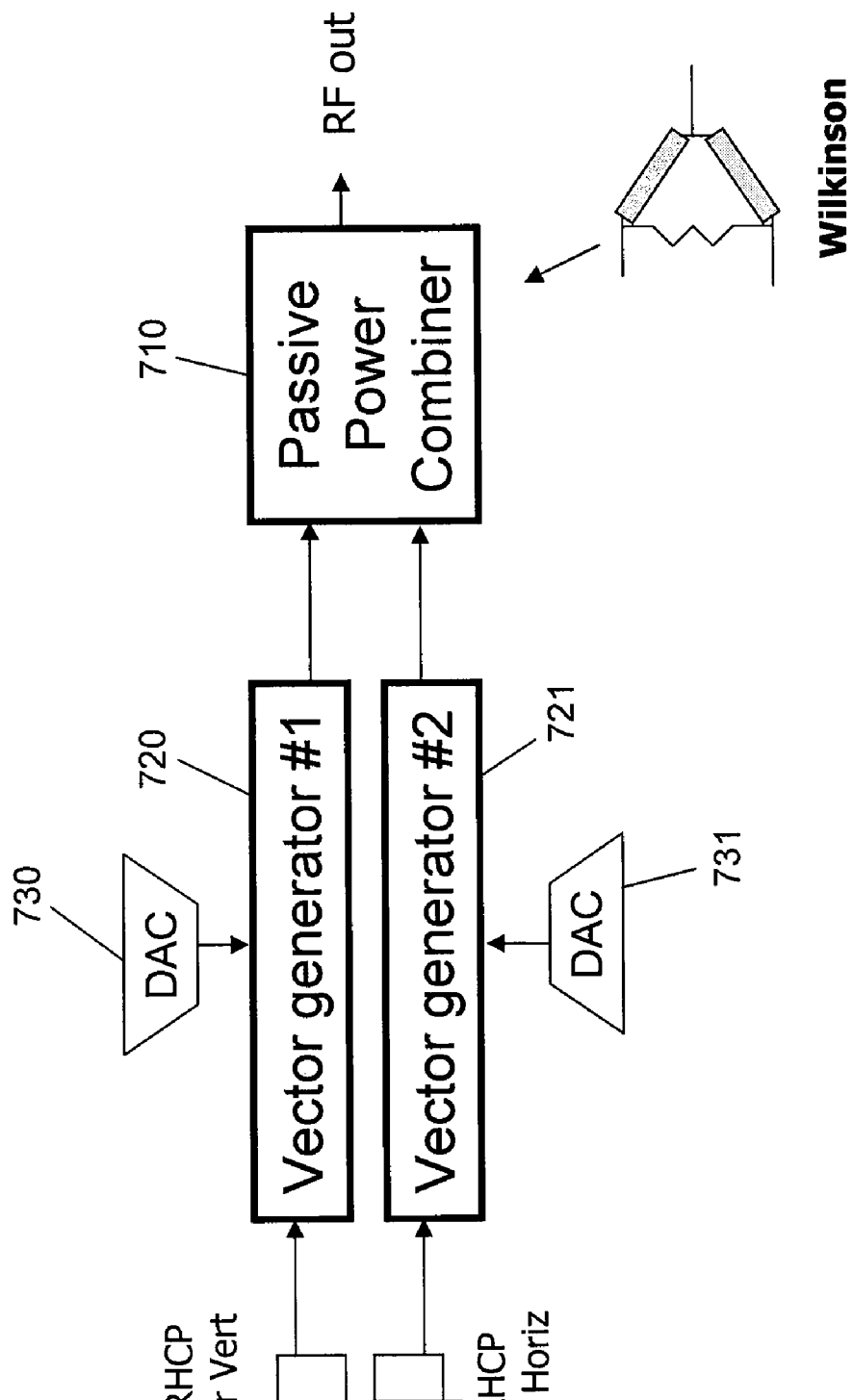
FIG. 7 illustrates an exemplary embodiment of a phased array antenna comprising a passive power combiner and configured for phase adjustment.

In an exemplary embodiment, and with reference to FIG. 5, a transmit active antenna polarizer 500 comprises an active power splitter 510, two vector generators 520, 521, and two DACs 530, 531. An input signal is actively split and transmitted through two vector generators 520, 521 in parallel. The vector generators 520, 521 are controlled by DACs 530, 531, and each vector generator produces a linear output signal. These two linear outputs are then used to energize the two spatially orthogonal feed ports of a radiating element (not shown). In another exemplary embodiment, the feeds to the radiating element can be differential in nature resulting in four feeds to the radiating element. In yet another exemplary embodiment, one of the feeds to the radiating elements can be differential while the other remains single-ended in nature resulting in three feeds to the radiating element.

The transmit active antenna polarizer 500 may be considered a basic transmit embodiment which is configured to be implemented in a variety of different phased array antenna architectures. In an exemplary embodiment, the basic transmit embodiment is used in any frequency band and with different polarizations. For example, and as described below, the basic transmit embodiment may be used as the basis for phased array antenna transmitting in linear polarization, circular polarization, or elliptical polarization. In accordance with an exemplary embodiment, in order to operate in these different polarizations, vector generators 520, 521 control the phase of the antenna signal.

In an exemplary embodiment, reconfiguration of DACs 530, 531 allows the number of phase bits to be digitally controlled after transmit active antenna polarizer 500 is fabricated if adequate DAC resolution and AGC dynamic range exists. In an exemplary embodiment with adequate DAC resolution and AGC dynamic range, any desired vector phase and amplitude can be produced with arbitrarily fine quantization steps using digital control. In another exemplary embodiment, DACs 530, 531 may be operationally reconfigured after transmit active antenna polarizer 500 is fabricated in order to facilitate adjustment of the signal amplitudes.

A receive active antenna polarizer (not shown) may be considered a basic receive embodiment which is configured to be implemented in a variety of different phased array antenna architectures. In an exemplary embodiment, the basic receive embodiment is used in any frequency band and with different polarizations. For example, and as described below, the basic receive embodiment may be used as the basis for phased array antenna receiving in linear polarization, circular polarization, or elliptical polarization. In accordance with an exemplary embodiment, in order to operate in these different polarizations, the vector generators control the phase of the antenna signal as described herein.

Described below are various specific phased array antenna system embodiments. The embodiments vary in terms of architecture, use of passive or active components, and whether differential or non-differential signaling is implemented. Though the exemplary embodiments of a phased array architecture are described in terms of a receive architecture, similar architectures could be implemented for transmitting signals in a phased array antenna. For example, RF power splitters would replace RF power combiners in the embodiments to facilitate the transmission of an RF signal.

In one exemplary embodiment, a combiner is in communication with two vector generators. The combiner may be either active or passive (see FIGS. 6 and 7). In an exemplary embodiment and with reference to FIG. 6, a phased array antenna 600 comprises an active combiner 610, two vector generators 620, 621, and two DACs 630, 631. A radiating element 601 is in communication with phased array antenna 600. Two spatially orthogonal feed ports of radiating element 601 transmit two input signals to vector generators 620, 621. The input signals are communicated through the two vector generators 620, 621 in parallel and actively summed to generate an RF output signal. The input signals may be linear, right-hand circular, left-hand circular, or elliptically polarized. The linear input signals may also be vertical and horizontal polarized. Vector generators 620, 621 enables phased array antenna 600 to have two degrees of freedom to allow the desired polarization to be detected and beam steering to be accomplished. In an exemplary embodiment, vector generator 620 may be used for beam steering while vector generator 621 offsets the phase of vector generator 620 by ±90 degrees to provide detection of RHCP signals or LHCP signals. Similar embodiments allow for the beam steering and polarization tracking of elliptically polarized signals as well.

Passive components may also be implemented in phased array antennas. In an exemplary embodiment, and with reference to FIG. 7, a phased array antenna 700 comprises a passive power combiner 710, two vector generators 720, 721, and two DACs 730, 731. Input signals are communicated through two vector generators 720, 721 in parallel and passively combined at passive power combiner 710 to generate an RF output signal. In one embodiment, passive power combiner 710 may be a Wilkinson power divider configured to combine the two vector generator outputs. In another embodiment, passive power combiner 710 may be any suitable power combiner now known or herein after devised. The input signals may be linear, right-hand circular, left-hand circular, or elliptically polarized. The linear input signals may also be vertical and horizontal polarized. Furthermore, phased array antenna 700 is capable of beam steering as described with respect to phased array antenna 600.

Figure 8:
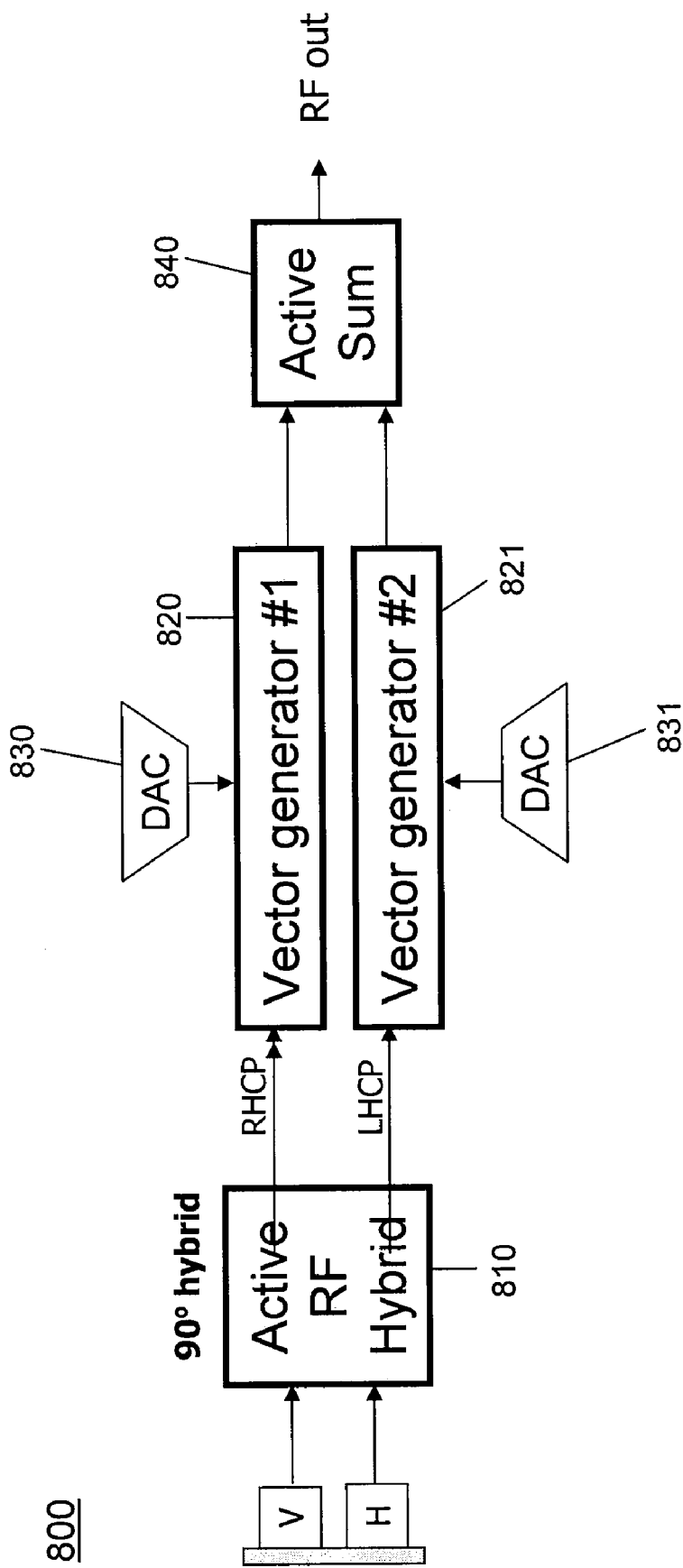
FIG. 8 illustrates an exemplary embodiment of a phased array antenna comprising an active RF hybrid configured for 90° operation and an active combiner, the phased array antenna being configured for phase adjustment.

In an exemplary embodiment, an RF hybrid is combined with two parallel vector generators and a combiner. The addition of an RF hybrid enables detection of LHCP and RHCP signals simultaneously. The combiner can be either active or passive. Similarly, the hybrid can be active or passive. Furthermore, the hybrid may be a 90° hybrid or a 180° hybrid. FIG. 8 illustrates an exemplary phased array antenna 800 comprising an active RF hybrid 810 with a 90° phase shift, two vector generators 820, 821, two DACs 830, 831, and an active combiner 840. The output signal is a composite of the two input signals.

Figure 9:
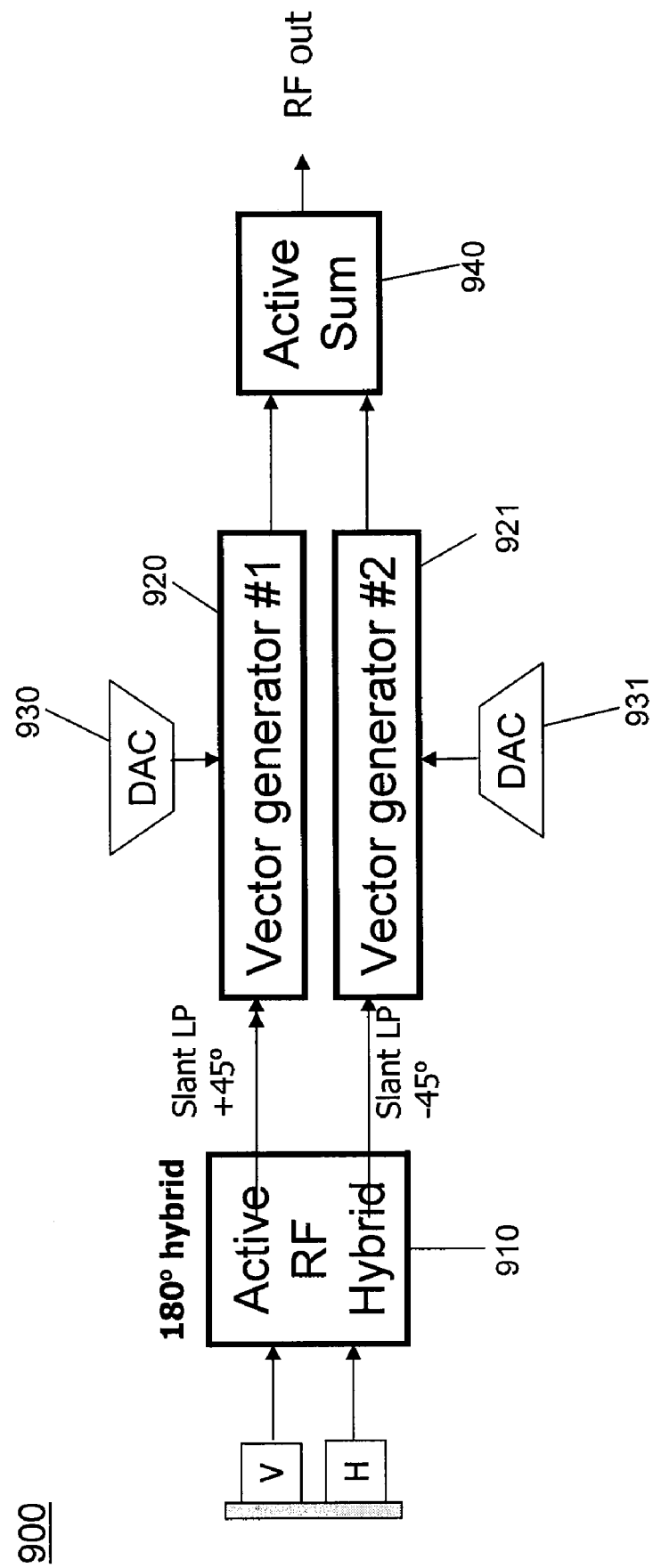
FIG. 9 illustrates an exemplary embodiment of a phased array antenna comprising an active RF hybrid configured for 180° operation and an active combiner, the phased array antenna being configured for phase adjustment.

Similarly, FIG. 9 illustrates an exemplary phased array antenna 900 comprising an active RF hybrid 910 with a 180° phase shift, two vector generators 920, 921, two DACs 930, 931, and an active combiner 940. In one embodiment, the two outputs of the 180° active RF hybrid 910 have a 90° phase difference. More specifically, the two outputs are +/−45° phase slanted from the inputs of the active RF hybrid 910. The output signal is a composite of the two input signals.

Figure 10:
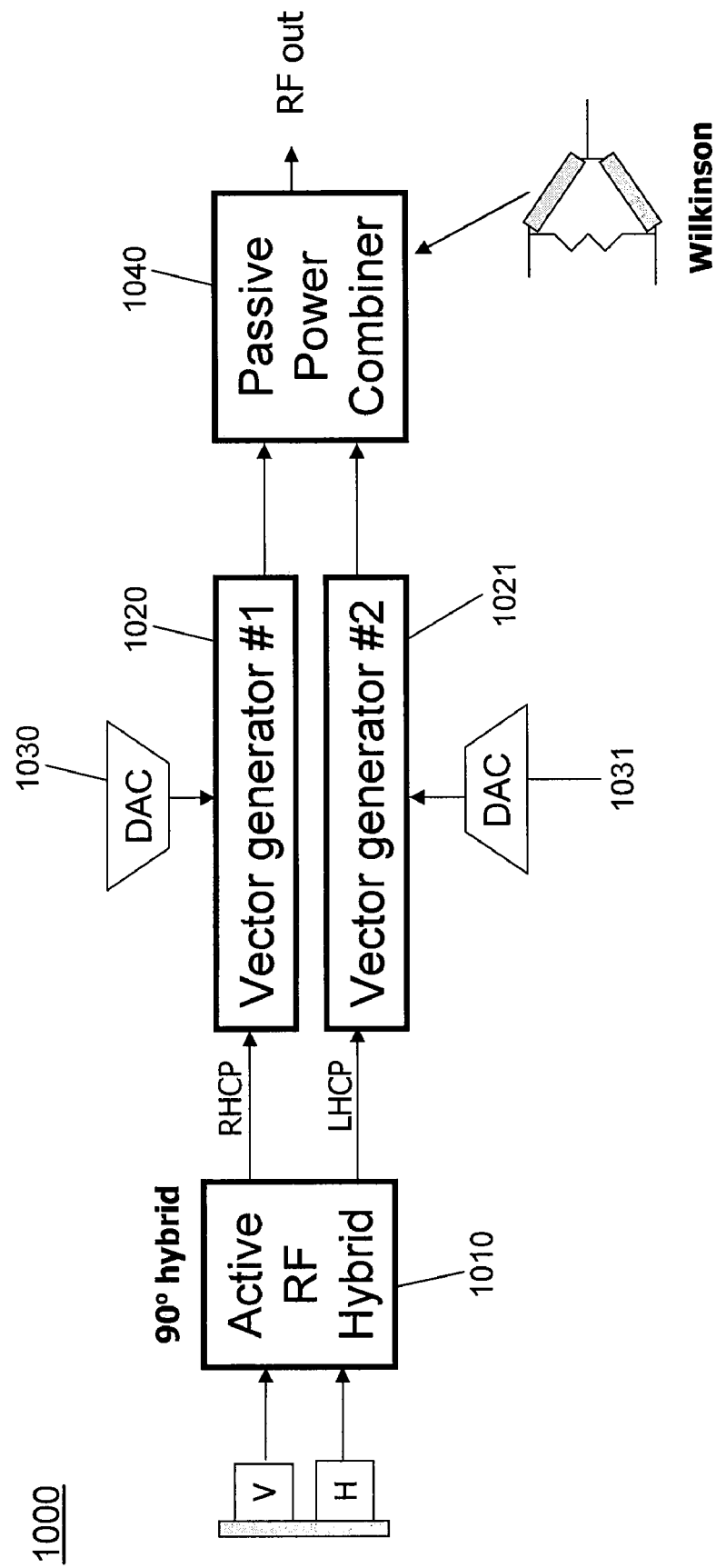
FIG. 10 illustrates an exemplary embodiment of a phased array antenna comprising an active RF hybrid configured for 90° operation and a passive power combiner, the phased array antenna being configured for phase adjustment.
Figure 11:
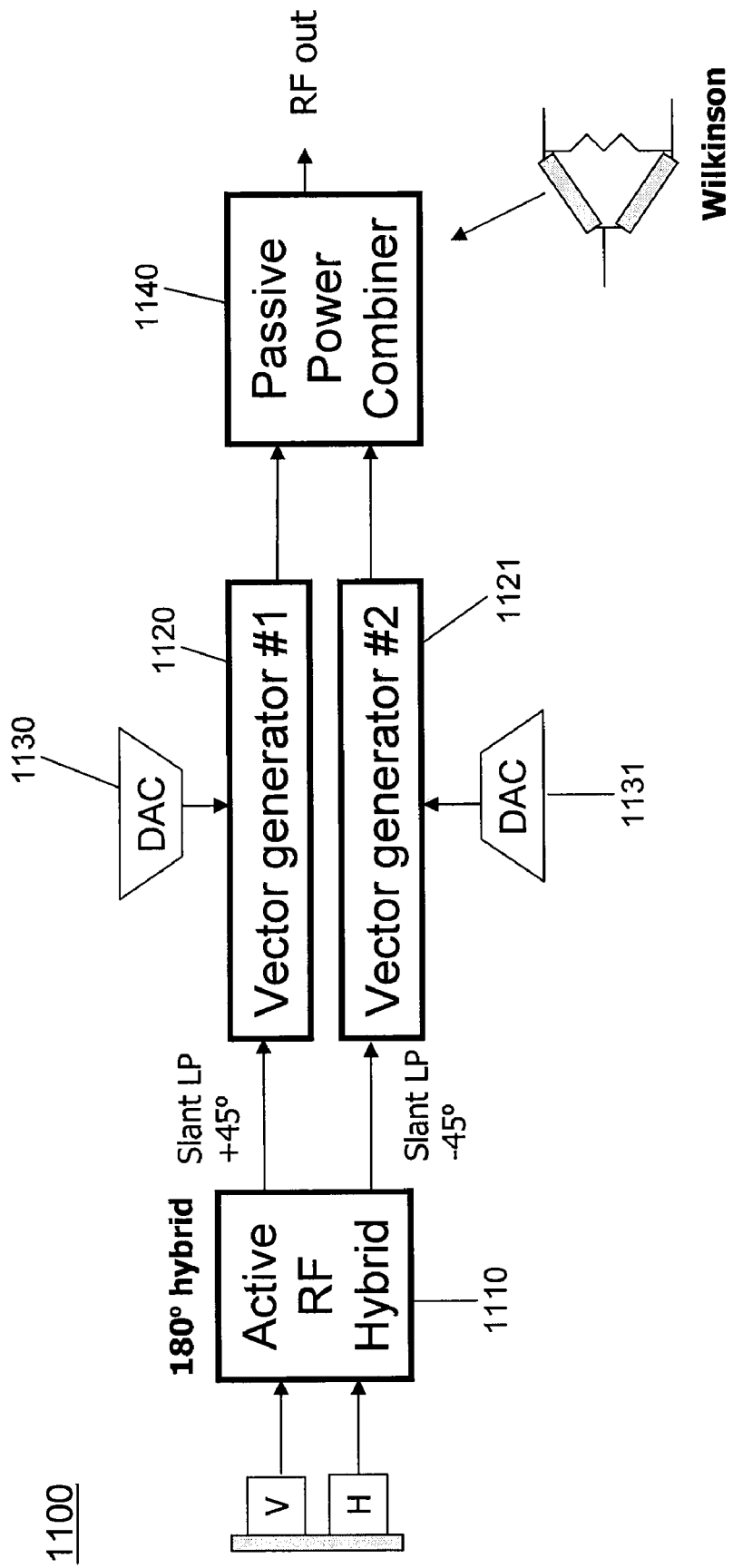
FIG. 11 illustrates an exemplary embodiment of a phased array antenna comprising an active RF hybrid configured for 180° operation and a passive power combiner, the phased array antenna being configured for phase adjustment.

In an exemplary embodiment and with reference to FIG. 10, a phased array antenna 1000 comprises a 90° active RF hybrid 1010, two vector generators 1020, 1021, two DACs 1030, 1031, and a passive power combiner 1040. This embodiment and the components are similar to the embodiment in FIG. 8, except the passive power combiner 1040 is implemented instead of an active power combiner. The output signal is a composite of the two input signals. Moreover, phased array antenna 1000 has higher loss and narrower bandwidth compared to phased array antenna 800.

As previously mentioned, the active hybrid could also be implemented as a 180° active hybrid. In an exemplary embodiment and with reference to FIG. 11, a phased array antenna 1100 comprises a 180° active RF hybrid 1110, two vector generators 1120, 1121, two DACs 1130, 1131, and a passive power combiner 1140. As an example, passive power combiner 1140 may be a Wilkinson power divider. In another embodiment, passive power combiner 1140 may be any suitable power combiner now known or herein after devised. In one embodiment, the two outputs of active RF hybrid 1110 have a 90° phase difference. More specifically, the two outputs are +/−45° phase slanted from the inputs of active RF hybrid 1110. In an exemplary embodiment, the two outputs of active RF hybrid 1110 may be any combination of phase slants that result in a 90° phase difference. The output signal is a composite of the two input signals.

Figure 12:
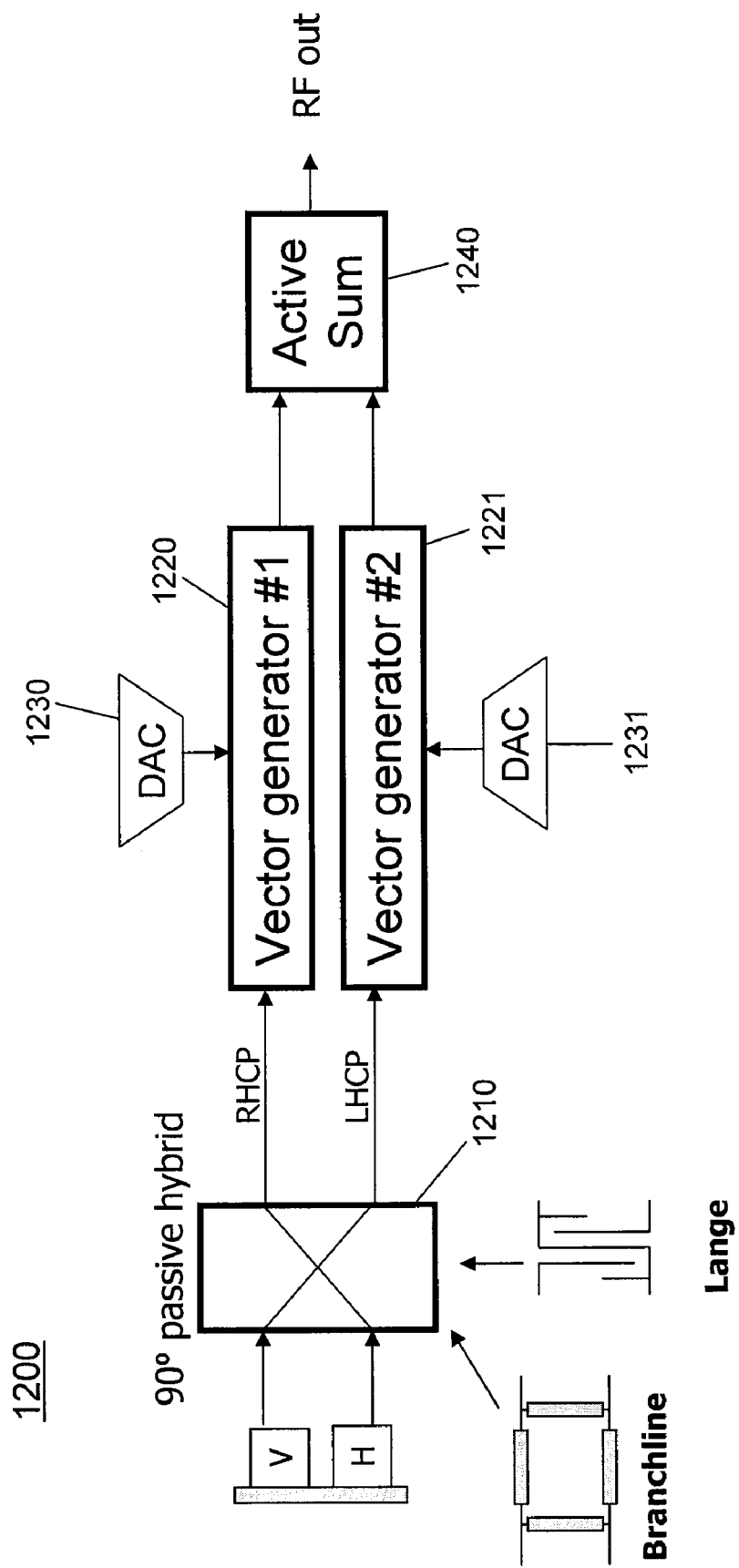
FIG. 12 illustrates an exemplary embodiment of a phased array antenna comprising a passive 90° hybrid and an active combiner and configured for phase adjustment.

In addition to passive combiners, a hybrid may also be a passive component. FIG. 12 illustrates a phased array antenna 1200 comprising a 90° passive hybrid 1210, two vector generators 1220, 1221, two DACs 1230, 1231, and an active combiner 1240. The output signals of 90° passive hybrid 1210 may be a right-hand circular, a left-hand circular, or elliptically polarized signal. The 90° passive hybrid 1210 may, for example, be a branchline coupler or a Lange coupler. The output signals of 90° passive hybrid 1210 are each a composite of the two input signals received from a radiating element. The main difference between 90° passive hybrid 1210 and 90° active RF hybrid 1010 is the size of the components, with 90° active RF hybrid 1010 being substantially smaller, in addition to the various advantages of active components as previously described.

Figure 13:
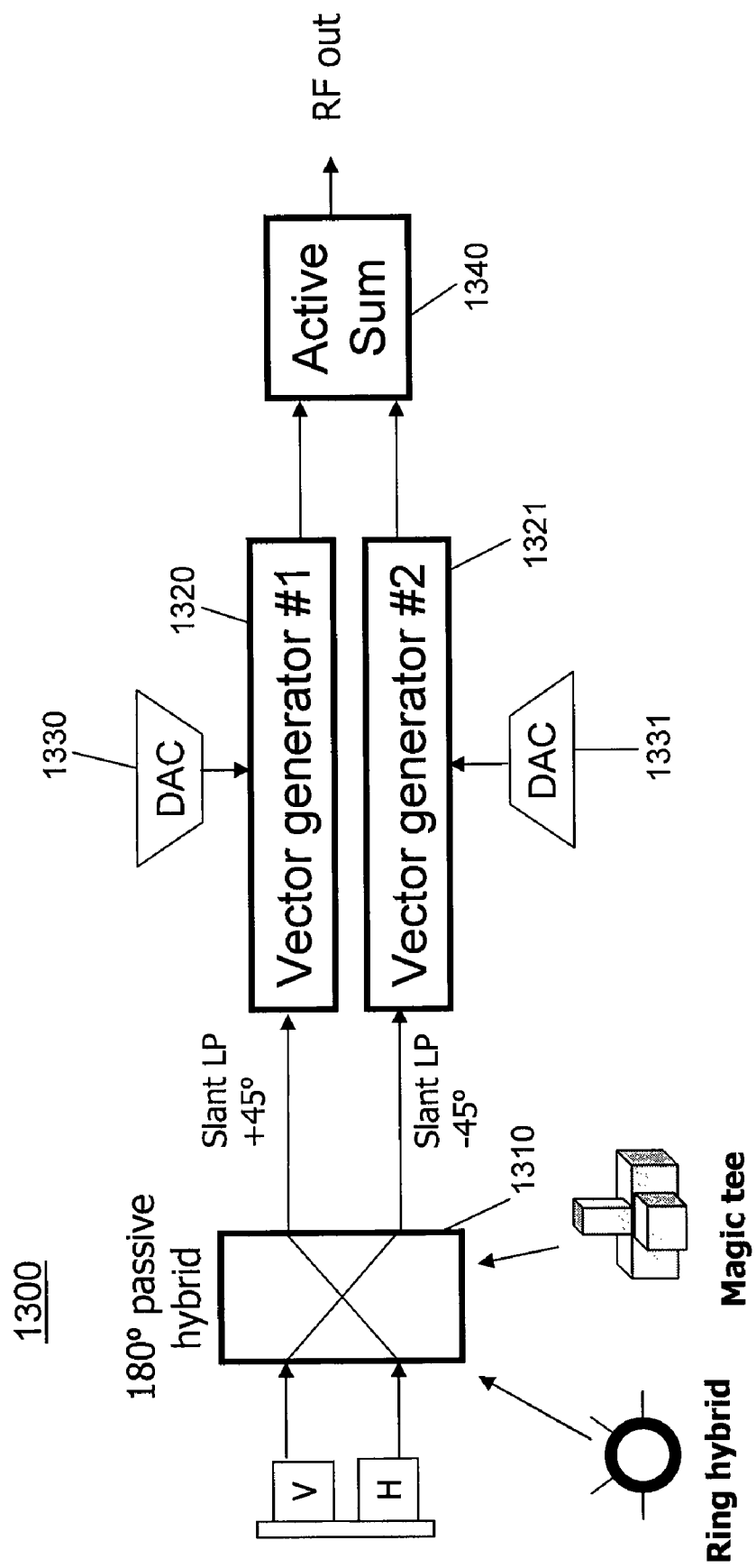
FIG. 13 illustrates an exemplary embodiment of a phased array antenna comprising a passive 180° hybrid and an active combiner and configured for phase adjustment.

In another exemplary embodiment and with reference to FIG. 13, a phased array antenna 1300 comprises a 180° passive hybrid 1310, two vector generators 1320, 1321, two DACs 1330, 1331, and an active combiner 1340. In one embodiment, the two outputs of the 180° passive hybrid 1310 have a 90° phase difference. More specifically, the two outputs are +/−45° phase slanted from the inputs of the passive hybrid 1310. The output signal is a single linearly polarized signal. In an exemplary embodiment, the 180° passive hybrid 1310 may be a ring hybrid or a magic tee.

Figure 14:
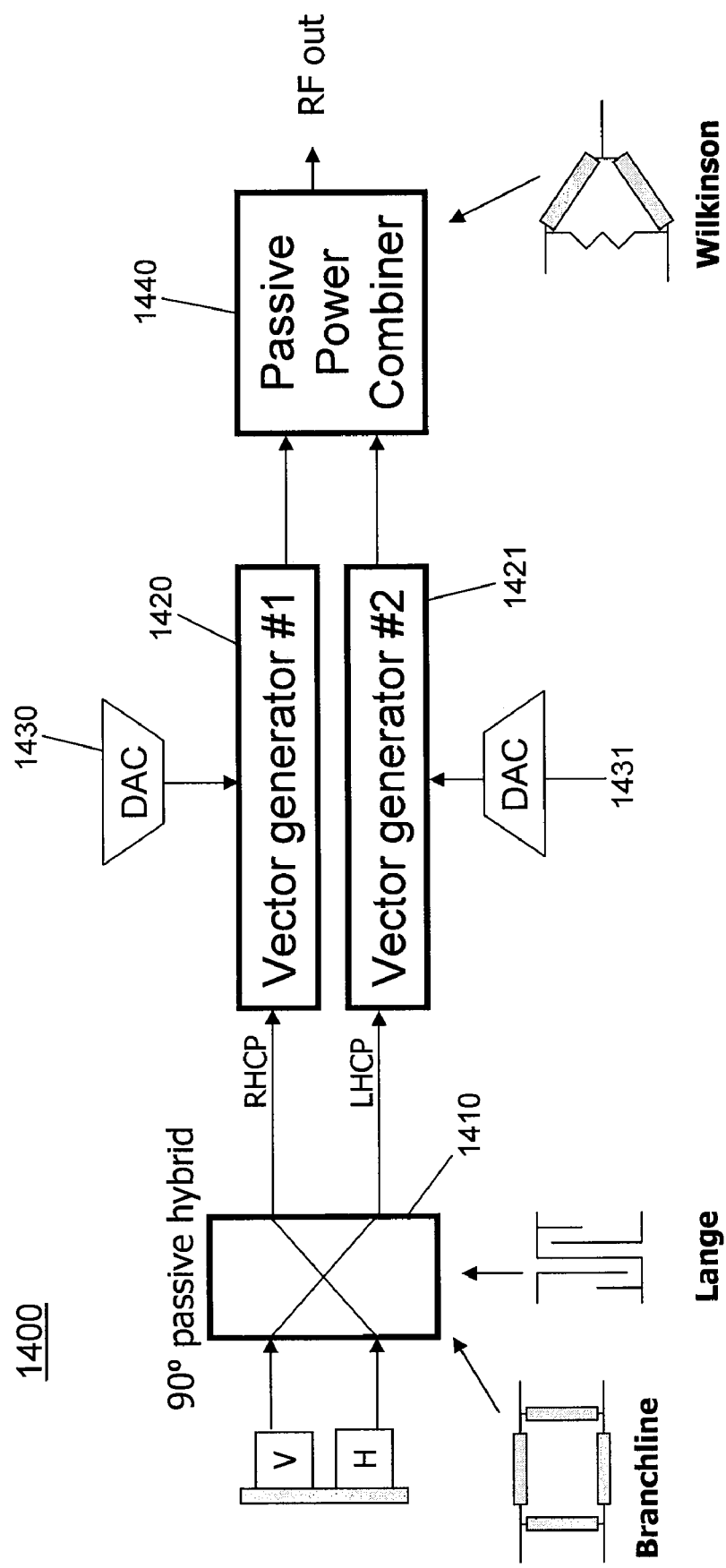
FIG. 14 illustrates an exemplary embodiment of a phased array antenna comprising a passive 90° hybrid and a passive power combiner and configured for phase adjustment.

With reference now to FIG. 14, a phased array antenna 1400 comprises a 90° passive hybrid 1410, two vector generators 1420, 1421, two DACs 1430, 1431, and a passive power combiner 1440. The output of passive hybrid 1410 may be a right-hand circular, left-hand circular, or elliptically polarized signal. The 90° passive hybrid 1410 may be a branchline coupler or a Lange coupler. Furthermore, passive power combiner 1440 may be a Wilkinson power divider. In another embodiment, passive power combiner 1440 may be any suitable power combiner now known or herein after devised. As with the other exemplary power combiners, the output of passive power combiner 1440 is a composite of the two input signals.

Figure 15:
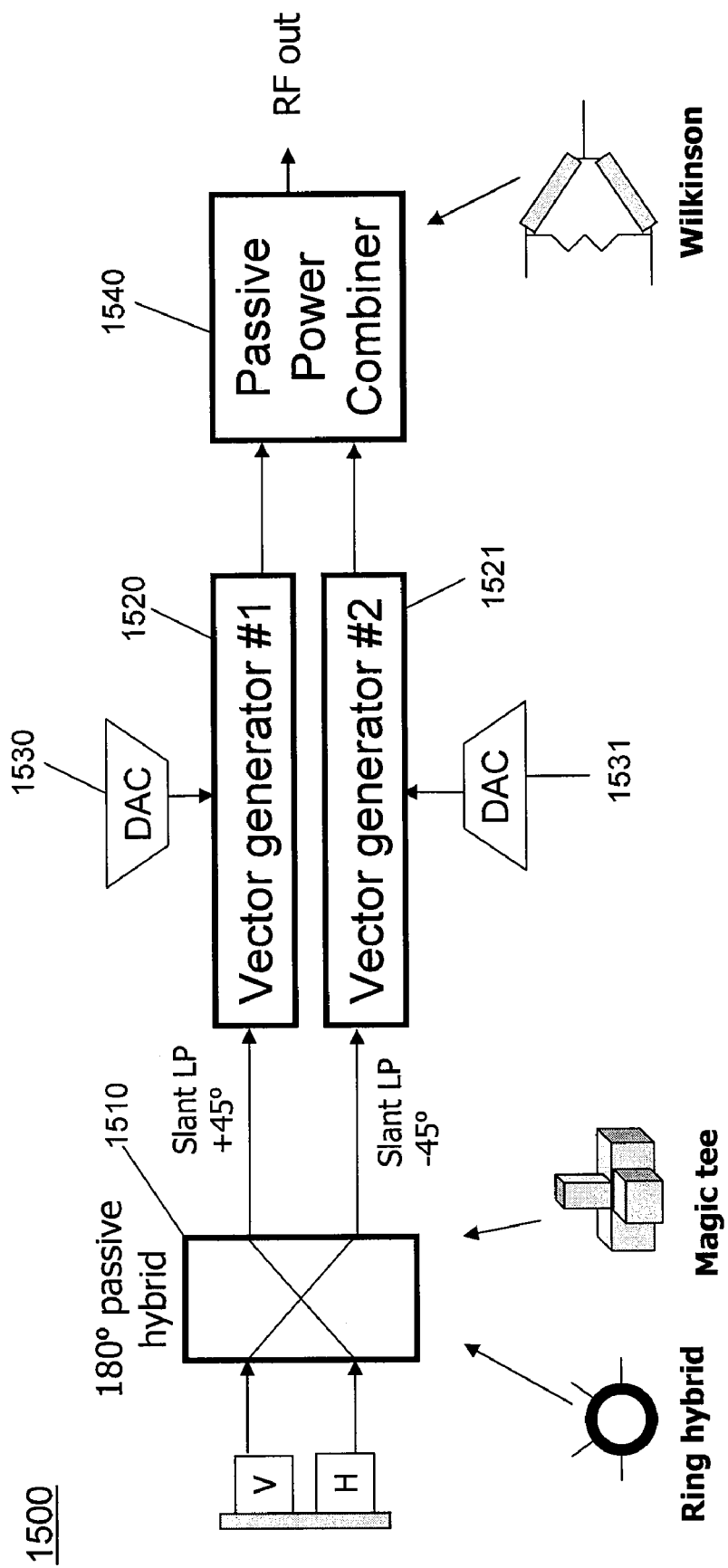
FIG. 15 illustrates an exemplary embodiment of a phased array antenna comprising a passive 180° hybrid and a passive power combiner and configured for phase adjustment.

Similarly, FIG. 15 illustrates a phased array antenna 1500 comprising a 180° passive hybrid 1510, two vector generators 1520, 1521, two DACs 1530, 1531, and a passive power combiner 1540. In one embodiment, the two outputs of 180° passive hybrid 1510 have a 90° phase difference. More specifically, the two outputs are +/−45° phase slanted from the inputs of 180° passive hybrid 1510. Additionally, in an exemplary embodiment, 180° passive hybrid 1510 may be a ring hybrid or a magic tee. In one exemplary embodiment, passive power combiner 1540 may be a Wilkinson power divider. In another embodiment, passive power combiner 1540 may be any suitable power combiner now known or herein after devised. Also, the output signal of passive power combiner 1540 is a composite of the two input signals.

Figure 16:
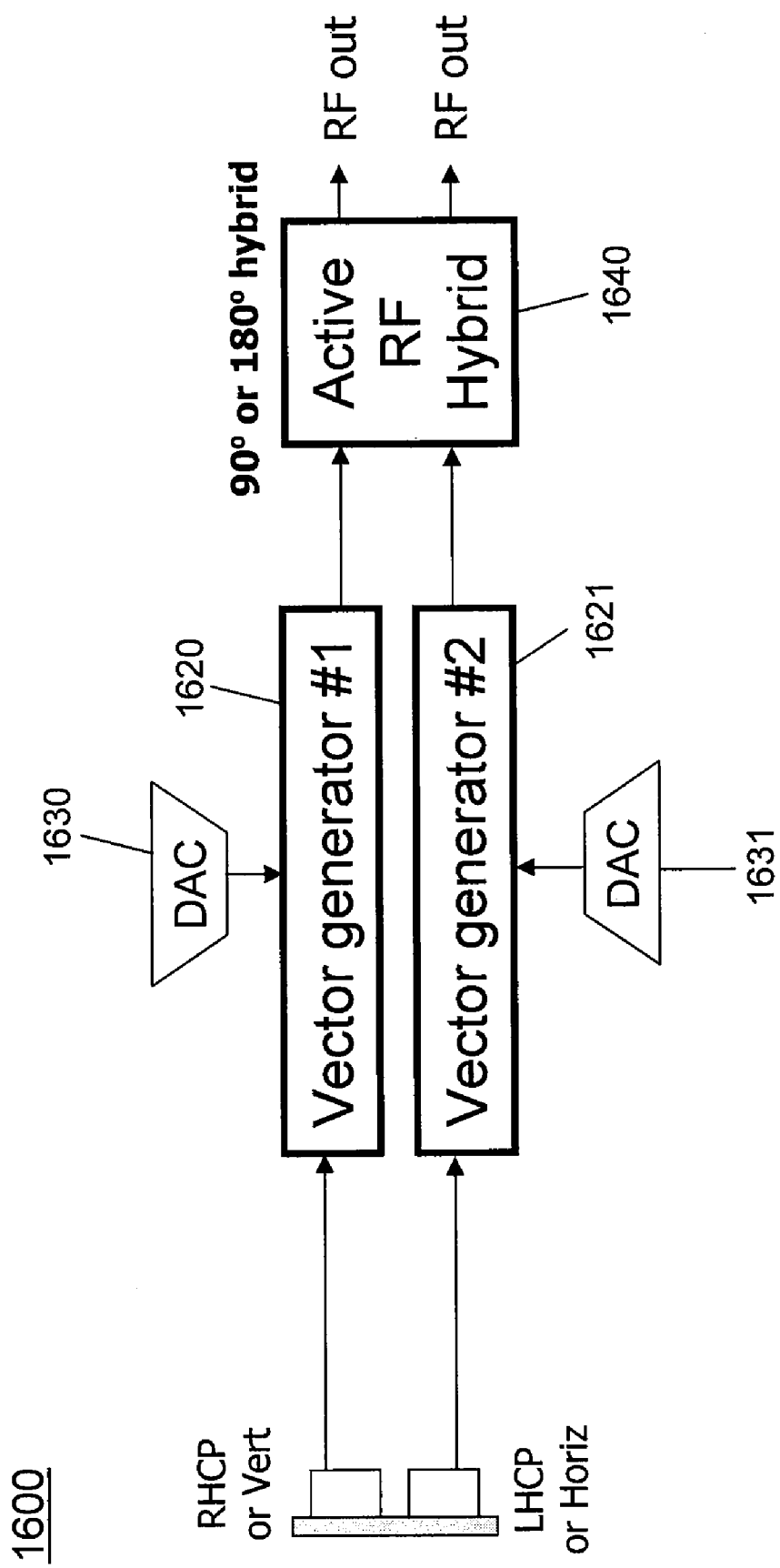
FIG. 16 illustrates an exemplary embodiment of a phased array antenna comprising an active RF hybrid and configured for phase adjustment.
Figure 17:
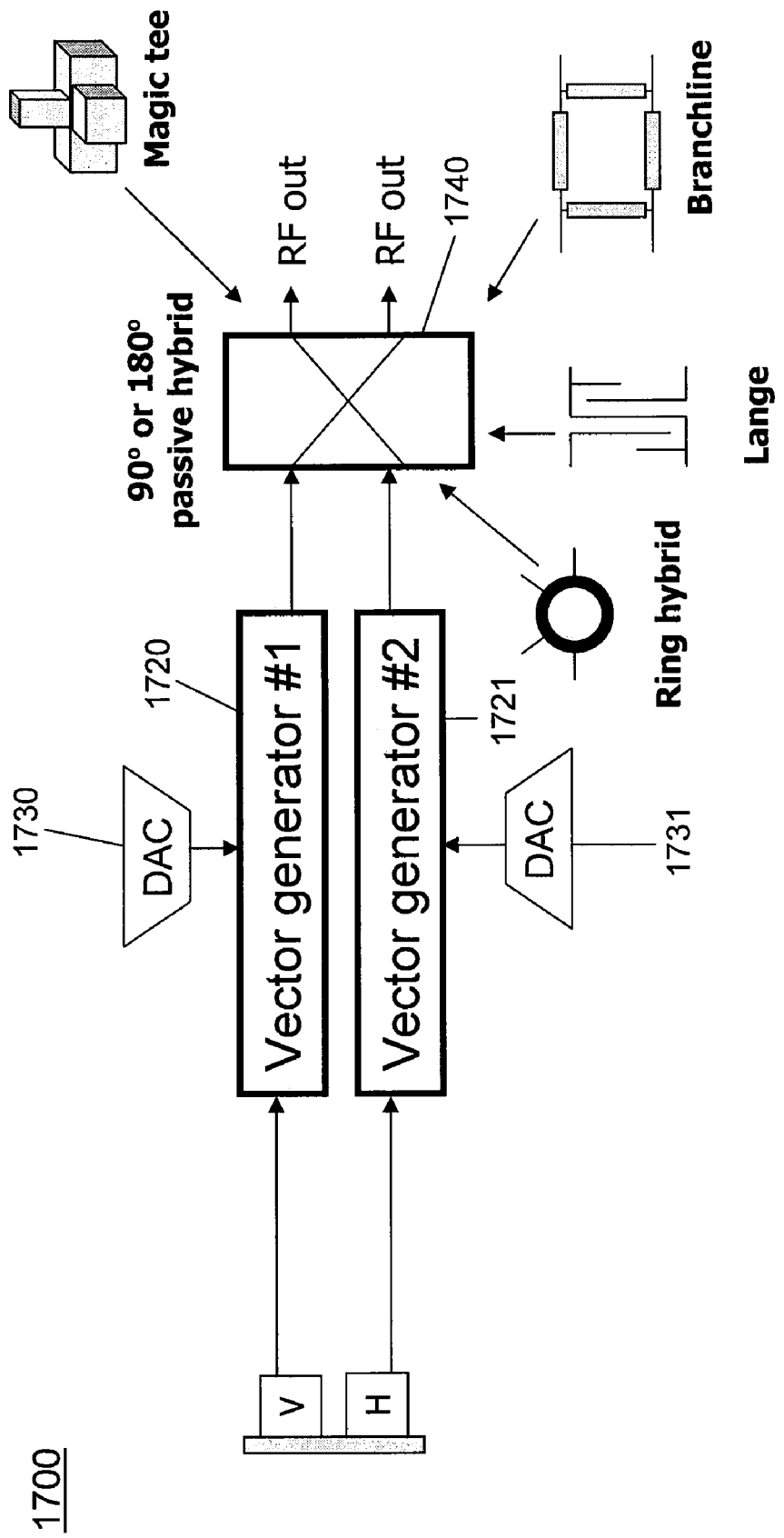
FIG. 17 illustrates an exemplary embodiment of a phased array antenna comprising a passive hybrid and configured for phase adjustment.

In addition to linearly polarized signals as described above, an active phased array antenna can also be configured for dual linear polarization with polarization tracking and beam steering. With reference to FIGS. 16 and 17, a phased array antenna with two parallel vector generators and a hybrid is illustrated. The hybrid may be either active or passive. Furthermore, the hybrid may be a 90° hybrid or a 180° hybrid. In accordance with an exemplary embodiment and with reference to FIG. 16, a phased array antenna 1600 comprises two vector generators 1620, 1621, two DACs 1630, 1631, and an active RF hybrid 1640. Active RF hybrid 1640 may be either a 90° hybrid or a 180° hybrid. The two output signals of the active RF hybrid 1640 are composites of the two input signals, with a phase difference between the output signals. In an embodiment with active RF hybrid 1640 comprising a 90° hybrid, the output signals have an approximate 90° phase difference. In an embodiment with active RF hybrid 1640 comprising a 180° hybrid, the output signals have an approximate 180° phase difference. The vector generators 1620, 1621 may be configured to provide phase and amplitude adjustment of RF signals for polarization tracking and beam steering.

Similarly, FIG. 17 illustrates a phased array antenna 1700 comprising two vector generators 1720, 1721, two DACs 1730, 1731, and a passive hybrid 1740. Passive RF hybrid 1740 may be either a 90° hybrid or a 180° hybrid. The passive hybrid 1740 may be at least one of a Lange coupler or a branchline coupler for a 90° hybrid, or at least one of a ring hybrid or a magic tee for a 180° hybrid. Furthermore, the output signals of passive hybrid 1740 are composites of the two input signals, with a phase difference between the output signals. In an embodiment with passive hybrid 1740 comprising a 90° hybrid, the output signals have an approximate 90° phase difference. In an embodiment with passive hybrid 1740 comprising a 180° hybrid, the output signals have an approximate 180° phase difference. The vector generators 1720, 1721 may be configured to provide phase and amplitude adjustment of RF signals for polarization tracking and beam steering.

With reference to FIGS. 18-21, a phased array antenna may include two parallel vector generators and two hybrids. The hybrids may be either active or passive. Furthermore, the hybrids may be a 90° hybrid or a 180° hybrid.

Figure 18:
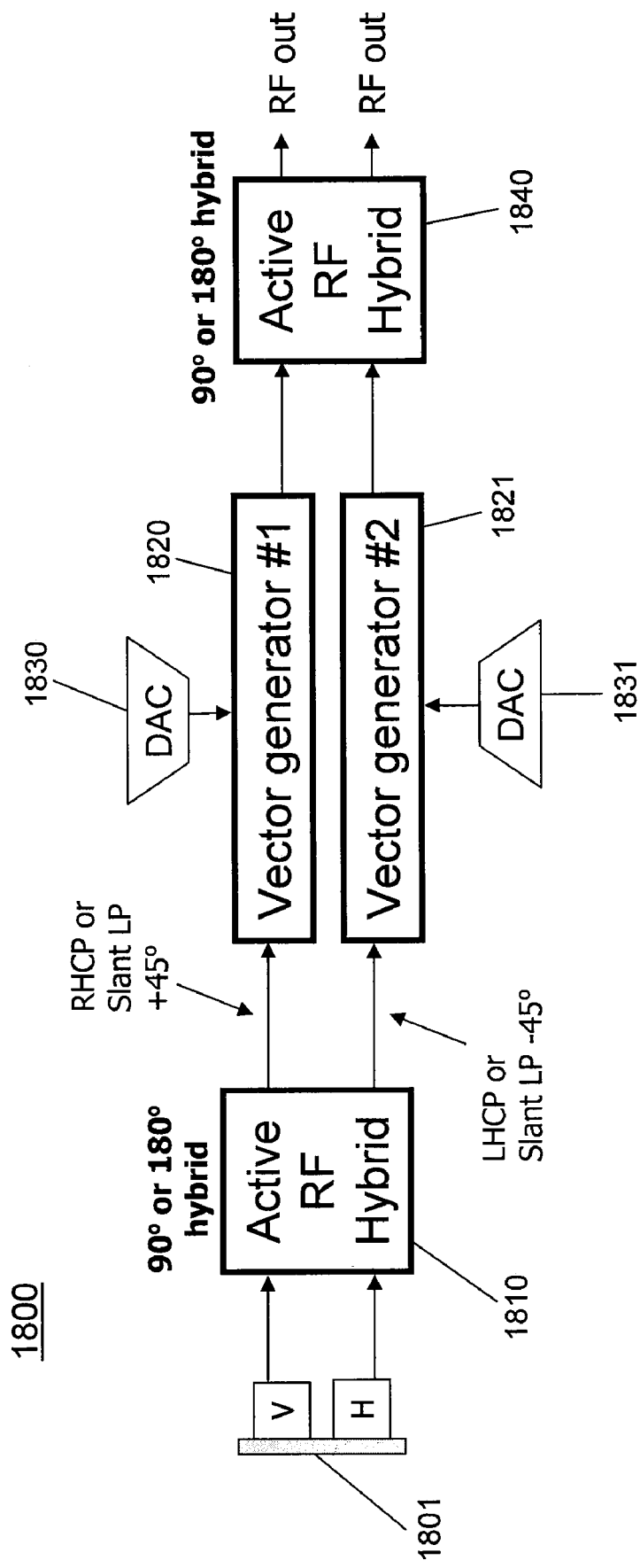
FIG. 18 illustrates an exemplary embodiment of a phased array antenna comprising two active RF hybrids and configured for phase adjustment.

In an exemplary embodiment and with reference to FIG. 18, a phased array antenna 1800 comprises a first active RF hybrid 1810, two vector generators 1820, 1821, two DACs 1830, 1831, and a second active RF hybrid 1840. First active RF hybrid 1810 may be either a 90° hybrid or a 180° hybrid. Second active RF hybrid 1840 may be either a 90° hybrid or a 180° hybrid. The first active RF hybrid 1810 is configured to receive polarized input signals from a radiating element 1801. In one embodiment, first active RF hybrid 1810 generates intermediate signals with right-hand and left-hand circular polarizations. In another embodiment, first active RF hybrid 1810 generates intermediate signals that have approximately a 90° phase difference. More specifically, the two outputs are +/−45° phase slanted from the inputs of the active RF hybrid 1810. The vector generators 1820, 1821 may be configured to provide phase adjustment for polarization tracking and beam steering. Also, second active RF hybrid 1840 is configured to generate output signals that are composites of the input signals.

Figure 19:
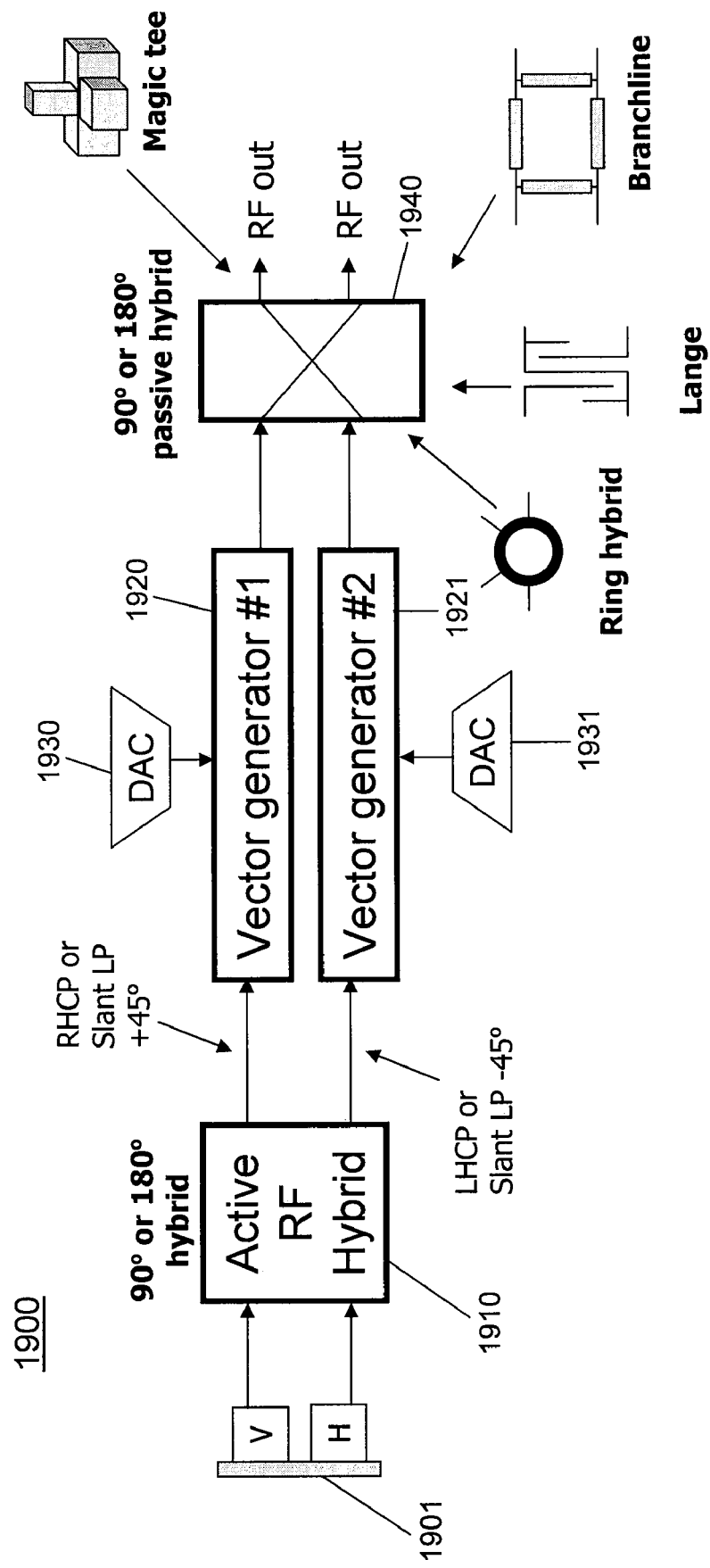
FIG. 19 illustrates an exemplary embodiment of a phased array antenna comprising an active RF hybrid and a passive hybrid and configured for phase adjustment.
Figure 20:
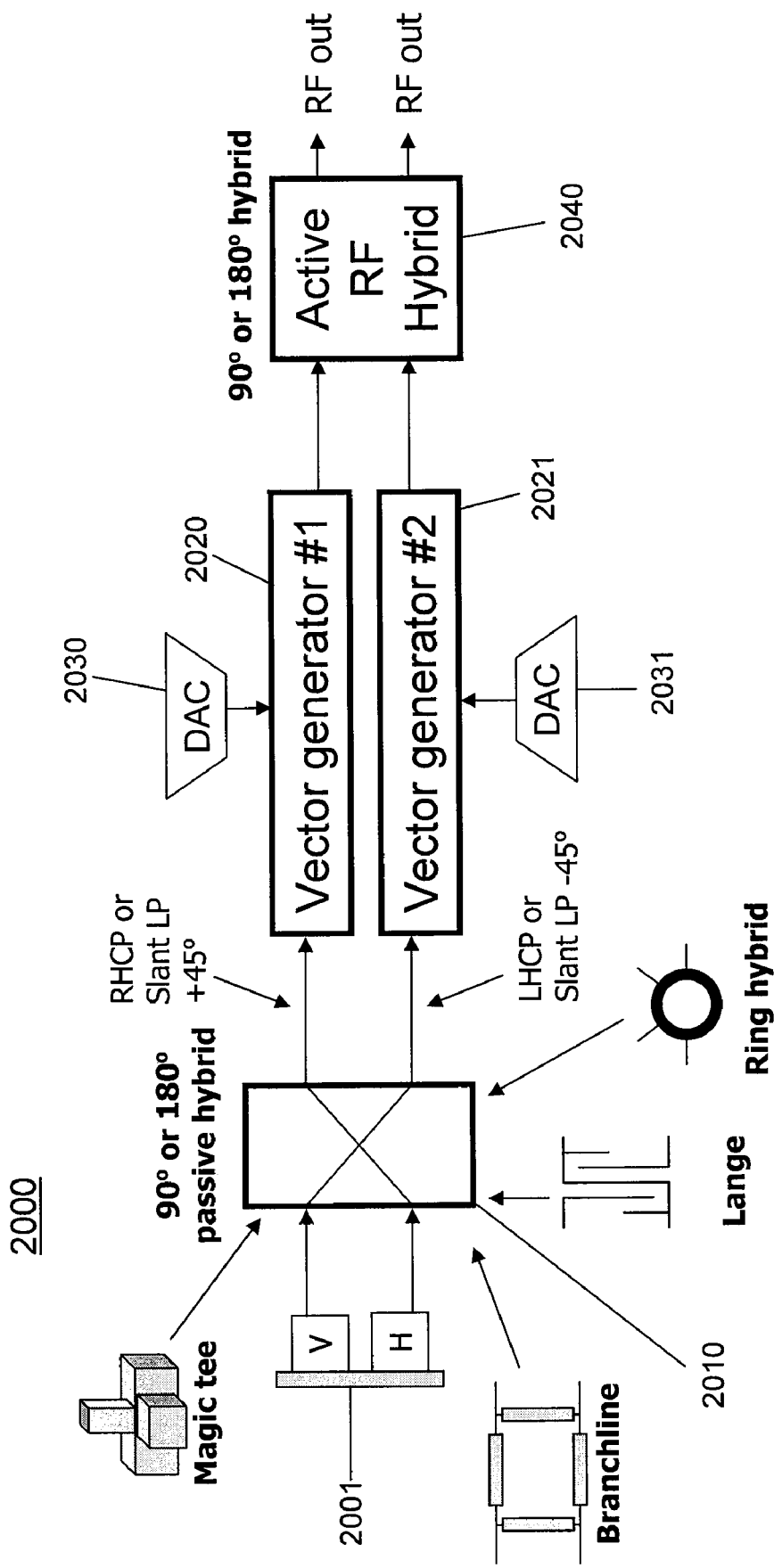
FIG. 20 illustrates an exemplary embodiment of a phased array antenna comprising an active RF hybrid and a passive hybrid and configured for phase adjustment.
Figure 21:
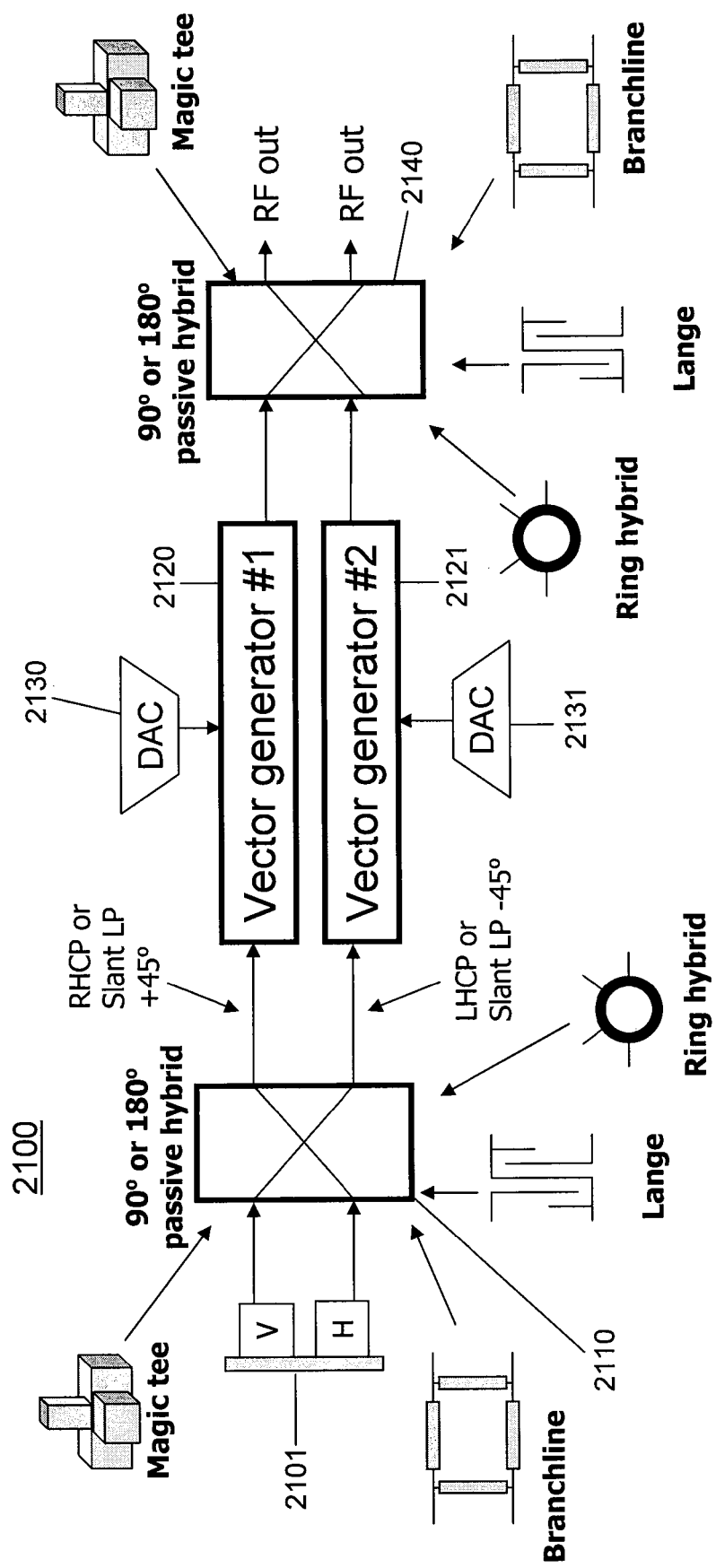
FIG. 21 illustrates an exemplary embodiment of a phased array antenna comprising two passive hybrids and configured for phase adjustment.
Figure 22:
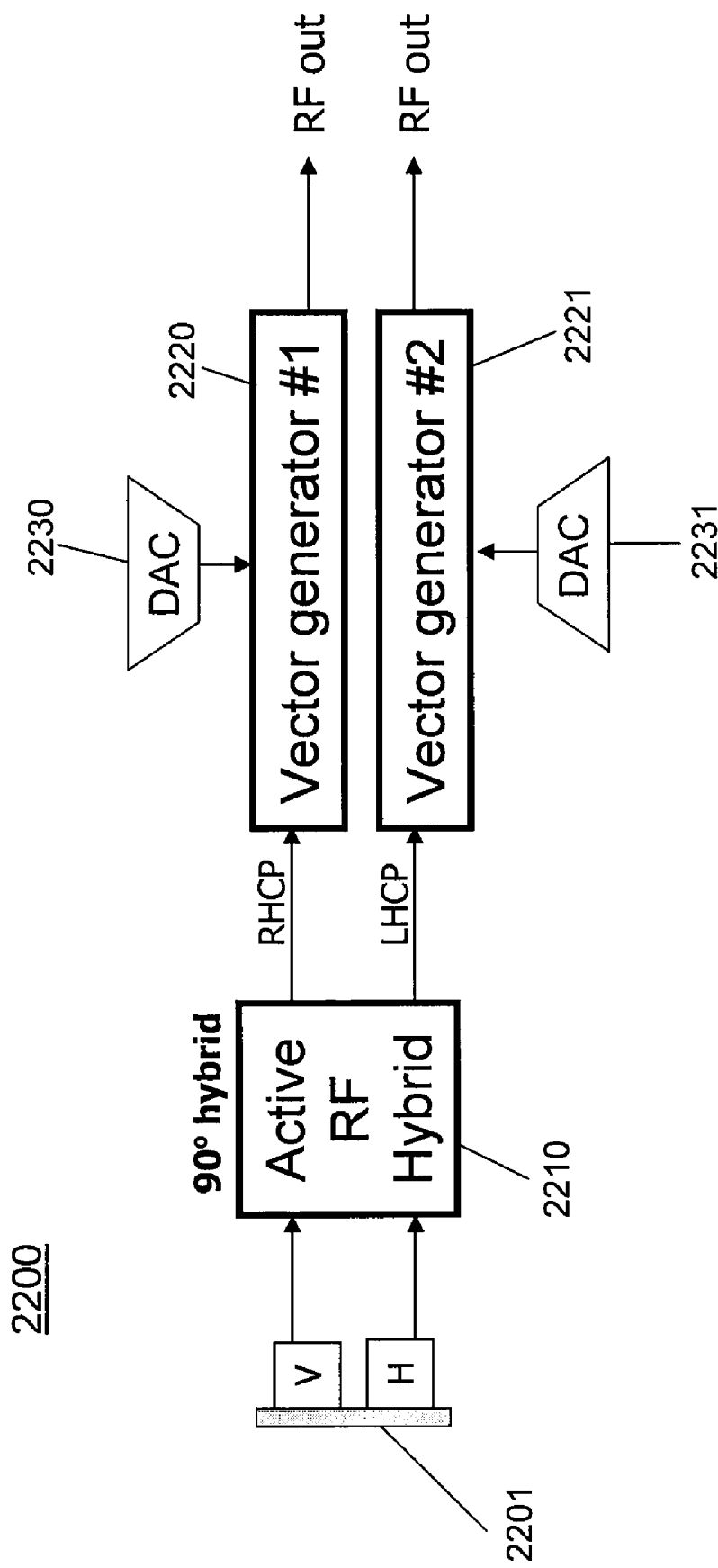
FIG. 22 illustrates an exemplary embodiment of a phased array antenna comprising an active RF hybrid and configured for phase adjustment.

Similarly, FIG. 19 illustrates a phased array antenna 1900 comprising an active RF hybrid 1910, two vector generators

1920, 1921, two DACs 1930, 1931, and a passive hybrid 1940. Active RF hybrid 1910 may be either a 90° hybrid or a 180° hybrid. Passive hybrid 1940 may be either a 90° hybrid or a 180° hybrid. The active RF hybrid 1910 is configured to receive polarized input signals from a radiating element 1901. In one embodiment, active RF hybrid 1910 generates intermediate signals with right-hand and left-hand circular polarizations. In another embodiment, active RF hybrid 1910 generates intermediate signals that have approximately a 90° phase difference. More specifically, the two outputs are +/−45° phase slanted from the inputs of active RF hybrid 1910. Furthermore, vector generators 1920, 1921 may be configured to provide phase adjustment for polarization tracking and beam steering. Also, passive hybrid 1940 is configured to generate output signals that are composites of the input signals. In an exemplary embodiment, passive hybrid 1940 may be at least one of a Lange coupler or a branchline coupler for a 90° hybrid, or at least one of a ring hybrid or a magic tee for a 180° hybrid.

Furthermore, the hybrid in communication with a radiating element could be a passive hybrid. In an exemplary embodiment and with reference to FIG. 20, a phased array antenna 2000 comprises a passive hybrid 2010, two vector generators 2020, 2021, two DACs 2030, 2031, and an active RF hybrid 2040. Passive hybrid 2010 may be either a 90° hybrid or a 180° hybrid. Active RF hybrid 2040 may be either a 90° hybrid or a 180° hybrid. The passive hybrid 2010 is configured to receive polarized input signals from a radiating element 2001. In one embodiment, the passive hybrid 2010 generates intermediate signals with right-hand and left-hand circular polarizations. In another embodiment the passive hybrid 2010 generates intermediate signals that have approximately a 90° phase difference. More specifically, the two outputs are +/−45° phase slanted from the inputs of the passive hybrid 2010. The passive hybrid 2010 may be at least one of a Lange coupler or a branchline coupler for a 90° hybrid, or at least one of a ring hybrid or a magic tee for a 180° hybrid. Furthermore, the vector generators 2020, 2021 may be configured to provide phase adjustment for polarization tracking and beam steering. Also, the active RF hybrid 2040 is configured to generate output signals that are composites of the input signals.

Another configuration of the phased array antenna may include two passive hybrids. In an exemplary embodiment and with reference to FIG. 21, a phased array antenna 2100 comprises a first passive hybrid 2110 with either a 90° or a 180° phase shift, two vector generators 2120, 2121, two DACs 2130, 2131, and a second passive hybrid 2140 with either a 90° or a 180° phase shift. First passive hybrid 2110 may be either a 90° hybrid or a 180° hybrid. Second passive hybrid 2140 may be either a 90° hybrid or a 180° hybrid. The first passive hybrid 2110 is configured to receive the polarized input signals from a radiating element 2101. In one embodiment, first passive hybrid 2110 generates intermediate signals with right-hand and left-hand circular polarizations. In another embodiment, first passive hybrid 2110 generates intermediate signals that have approximately a 90° phase difference. More specifically, the two outputs are +/−45° phase slanted from the inputs of first passive hybrid 2110. In an exemplary embodiment, vector generator 2120 receives a first intermediate signal communicated from first passive hybrid 2110. Vector generator 2121 receives a second intermediate signal also communicated from first passive hybrid 2110. Vector generators 2120, 2121 are respectively configured to adjust at least one of the phase and amplitude of a received signal and generate an adjusted signal. The second passive hybrid 2140 is configured to receive adjusted signals from vector generators 2120, 2121 and configured to generate output signals that are composites of the adjusted signals. The first and second passive hybrids 2110, 2140 may be at least one of a Lange coupler or a branchline coupler for a 90° hybrid, or at least one of a ring hybrid or a magic tee for a 180° hybrid.

In addition to embodiments as described above, an active phased array antenna can also be configured for dual circular polarization with beam steering. With momentary reference to FIGS. 22 and 23, in an exemplary embodiment a phased array antenna comprises a 90° hybrid in communication with a radiating element and parallel vector generators. In an exemplary embodiment, the 90° hybrid may be active or passive. In accordance with an exemplary embodiment and with reference to FIG. 22, a phased array antenna 2200 comprises an active 90° RF hybrid 2210, two vector generators 2220, 2221, and two DACs 2230, 2231. The active 90° RF hybrid 2210 is configured receive signals from a radiating element 2201 and to generate intermediate signals with right-hand and left-hand circular polarization. The intermediate signals are each a composite signal of the signals received from radiating element 2201. The two vector generators 2220, 2221 are in communication with active 90° RF hybrid 2210. Vector generator 2220 and vector generator 2221 individually generate an RF output signal with circular polarization. In an exemplary embodiment, vector generators 2220, 2221 provide phase adjustment for beam steering.

Figure 23:
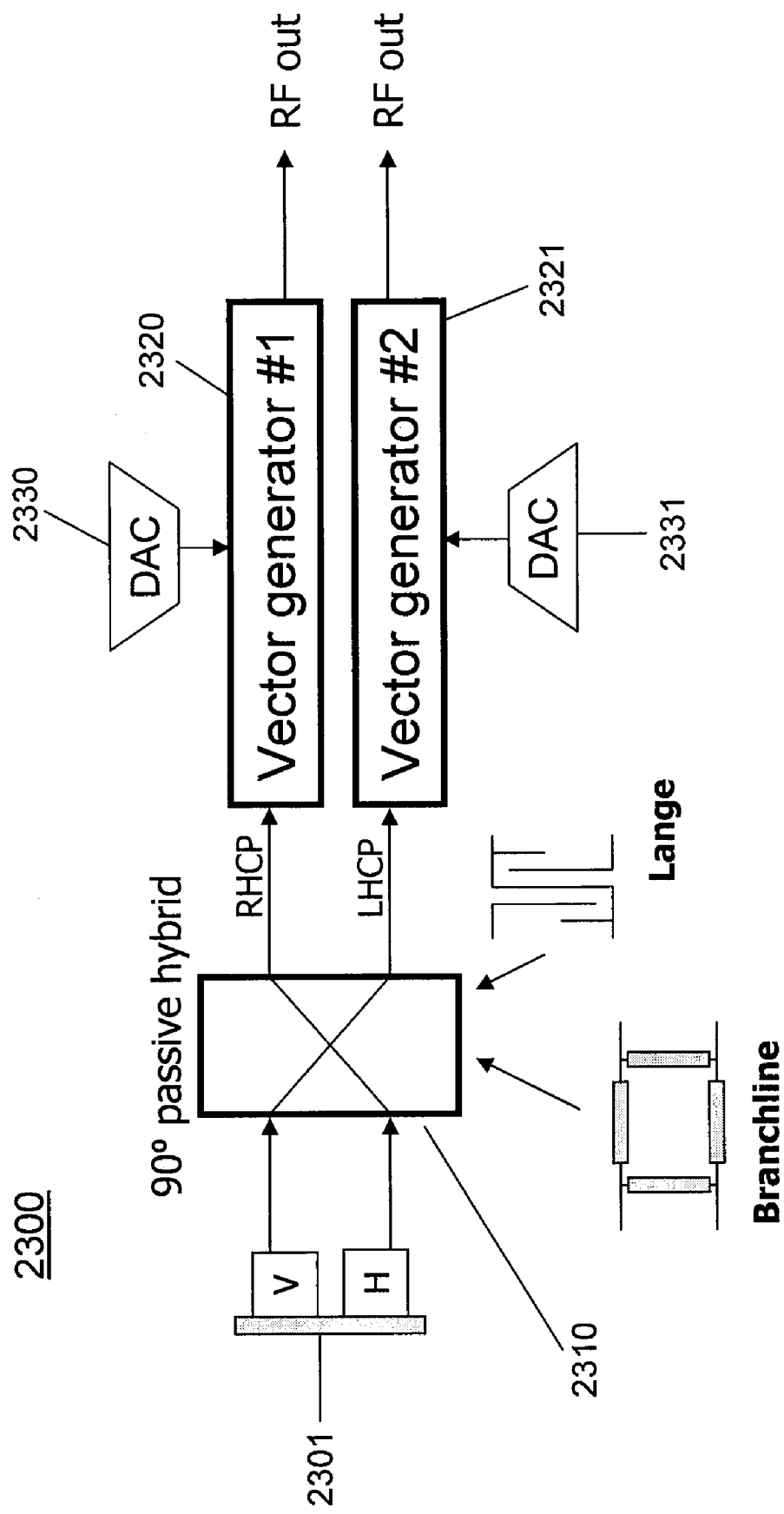
FIG. 23 illustrates an exemplary embodiment of a phased array antenna comprising a passive hybrid and configured for phase adjustment.

Similarly, with reference to FIG. 23 and in an exemplary embodiment, a phased array antenna 2300 comprises a passive 90° hybrid 2310, two vector generators 2320, 2321, and two DACs 2330, 2331. The passive 90° hybrid 2310 may be a branchline coupler or a Lange coupler, and/or the like. Additionally, passive 90° hybrid 2310 is configured to receive signals from a radiating element 2301 and to generate intermediate signals with right-hand and left-hand circular polarization. The two vector generators 2320, 2321 are in communication with passive 90° hybrid 2310 and each receive a separate intermediate signal. In an exemplary embodiment, vector generators 2320, 2321 individually output an RF output signal that is a composite of the intermediate signals. In an exemplary embodiment, vector generators 2320, 2321 provide phase adjustment for beam steering.

Figure 24:
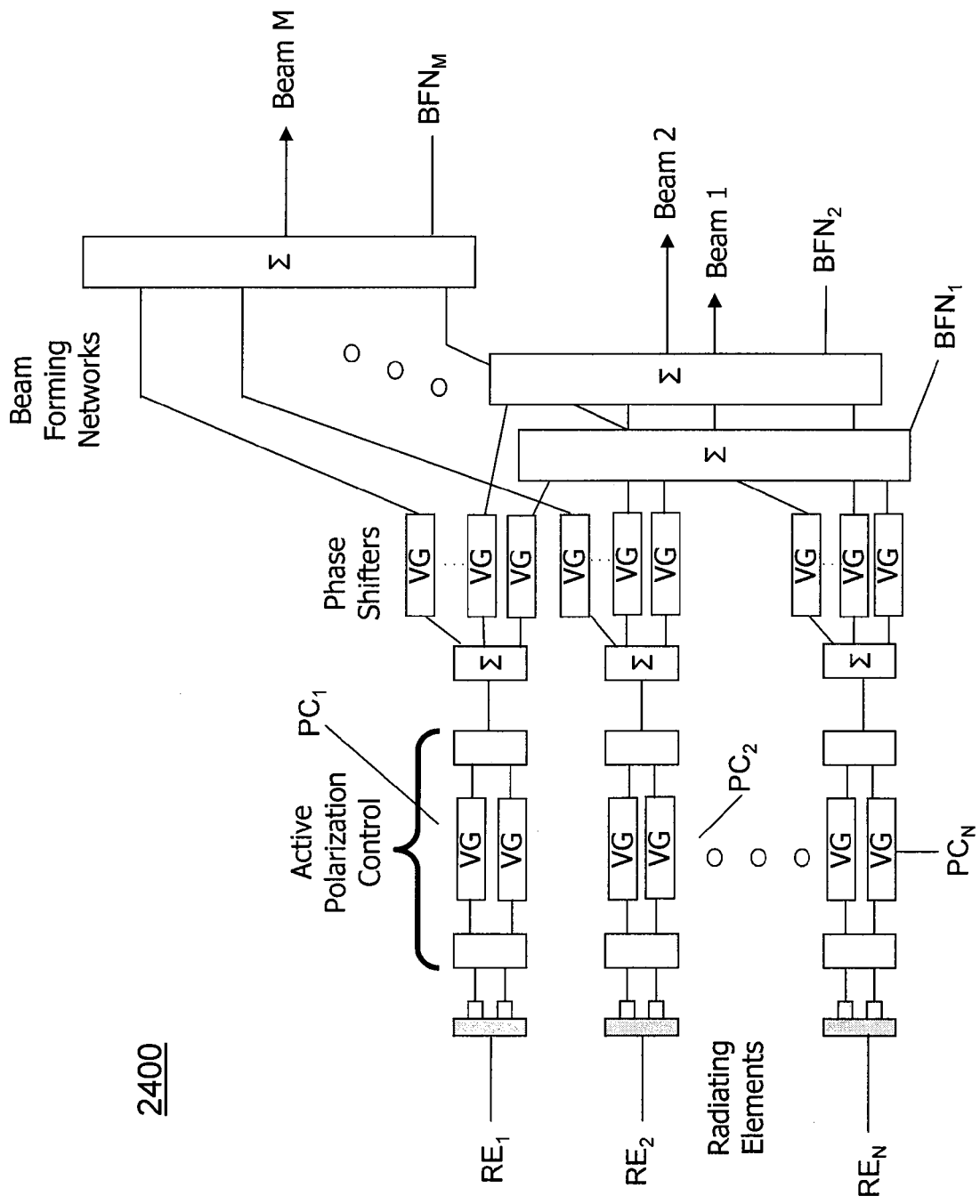
FIG. 24 illustrates an exemplary embodiment of a multi-beam architecture.

In accordance with an exemplary embodiment and with reference to FIG. 24, a multi-beam architecture 2400 comprises multiple radiating elements ($RE_1$, $RE_2$, ... $RE_N$) with each radiating element being in communication with an active polarization control ($PC_1$, $PC_2$ ... $PC_N$). The multi-beam architecture 2400 further comprises at last one beam forming network ($BFN_1$, $BFN_2$, ... $BFN_M$) and at least one phase shifter connected to the active polarization control ($PC_1$, $PC_2$, ... $PC_N$) per beam forming network ($BFN_1$, $BFN_2$, ... $BFN_M$). In an exemplary embodiment, each radiating element is in communication with M phase shifters, and each phase shifter is in communication with M beam forming networks so that each beam forming network receives a signal from each radiating element.

In an exemplary embodiment, the phase shifters may be active vector generators, similar to vector generator 400, or any other component suitable to phase shift the signals. Furthermore, the beam forming networks and summing junctions can be passive or active. Moreover, a multi-beam architecture may similarly be implemented for transmission of RF signals.

With further reference to FIG. 24, the active polarization control functions ($PC_1$, $PC_2$, ... $PC_N$) can be any of the embodiments previously listed herein. Connected to each of the active polarization control functions is a power splitter (for receive applications) or power combiner (for transmit applications). The power splitter or power combiner can be implemented as a passive or active structure as described previously herein. In communication with the power splitter/combiner is a set of vector generators where each vector generator provides a phase shift in support of a particular beam. M vector generators are required to support M independently steerable beams. In an exemplary embodiment, the set of vector generators is in communication with a power combiner (for receive applications) or power splitter (for transmit applications) to complete the beam formation process. The power splitter or power combiner can be implemented as a passive or active structure as described previously herein.

The following applications are related to this subject matter: U.S. application Ser. No. 12/759,123, entitled "ACTIVE BUTLER AND BLASS MATRICES," which is being filed contemporaneously herewith; U.S. application Ser. No. 12/759,043, entitled "ACTIVE HYBRIDS FOR ANTENNA SYSTEMS," which is being filed contemporaneously herewith; U.S. application Ser. No. 12/759,064, entitled "ACTIVE FEED FORWARD AMPLIFIER," which is being filed contemporaneously herewith; U.S. application Ser. No. 12/759,059, entitled "MULTI-BEAM ACTIVE PHASED ARRAY ARCHITECTURE," which is being filed contemporaneously herewith; U.S. application Ser. No. 12/758,996, entitled "PRESELECTOR AMPLIFIER," which is being filed contemporaneously herewith; U.S. application Ser. No. 12/759,148, entitled "ACTIVE POWER SPLITTER," which is being filed contemporaneously herewith; U.S. application Ser. No. 12/759,112, entitled "HALF-DUPLEX PHASED ARRAY ANTENNA SYSTEM," which is being filed contemporaneously herewith; U.S. application Ser. No. 12/759,113, entitled "DIGITAL AMPLITUDE CONTROL OF ACTIVE VECTOR GENERATOR," which is being filed contemporaneously herewith; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. A phased array antenna in communication with as radiating element, the phased array antenna comprising:
   a 90° hybrid configured to receive dual linearly polarized RF signals from the radiating element, wherein the 90° hybrid is configured to inject a 90° phase shift and generate a RHCP intermediate signal and a LHCP intermediate signal;
   a first vector generator configured to receive the RHCP intermediate signal, wherein the first vector generator is configured to phase adjust the RHCP intermediate signal for beam steering and output a first RF signal; and
   a second vector generator configured to receive the LHCP intermediate signal, wherein the second vector generator is configured to phase adjust the LHCP intermediate signal for beam steering and output a second RF signal;
   wherein the first vector generator and the second vector generated individually comprise a first quadrant select in parallel with a second quadrant select and a first variable gain amplifier in parallel with a second variable gain amplifier.

2. The phased array antenna of claim 1, wherein the 90° hybrid is a 90° active hybrid.

3. The phased array antenna of claim 1, wherein the 90° hybrid is a 90° passive hybrid, and wherein the 90° passive hybrid is one of a branchline hybrid and a Lange coupler.

4. A phased array antenna in communication with a radiating element, the phased array antenna comprising:
   a first vector generator configured to receive a first signal from the radiating element, wherein the first vector generator is configured to provide phase and amplitude adjustment of the first signal for polarization tracking and beam steering and output a first intermediate signal;
   a second vector generator configured to receive a second signal from the radiating element, wherein the second vector generator is configured to provide phase and amplitude adjustment of the second signal for polarization tracking and beam steering and output a second intermediate signal; and
   a hybrid configured to receive the first intermediate signal and the second intermediate signal and generate two RF output signals with a phase difference, wherein the two RF output signals are each a composite of the first intermediate signal and the second intermediate signal;
   wherein the first vector generator and the second vector generator individually comprise a first quadrant select in parallel with a second quadrant select and a first variable gain amplifier in parallel with a second variable gain amplifier.

5. The phased array antenna of claim 4, wherein the hybrid is a 90° active hybrid configured to generate a 90° phase difference.

6. The phased array antenna of claim 4, wherein the hybrid is a 180° active hybrid configured to generate a 180° phase difference.

7. The phased array antenna of claim 4, wherein the hybrid is a 90° passive hybrid, and wherein the 90° passive hybrid is one of a branchline hybrid and a Lange coupler, 8. The phased array antenna of claim 4, wherein the hybrid is a 180° passive hybrid, and wherein the 180° passive hybrid is one of a magic tee and a ring hybrid.

9. A phased array antenna in communication with a radiating element, the phased array antenna comprising:
   a first vector generator configured to receive a first signal from the radiating element, wherein the first vector generator is configured to provide phase and amplitude adjustment of the first signal for polarization tracking and beam steering, and to output a first intermediate signal;
   a second vector generator configured to receive a second signal from the radiating element, wherein the second vector generator is configured to provide phase and amplitude adjustment of the second signal for polarization tracking and beam steering, and to output a second intermediate signal; and
   a combiner configured to receive the first intermediate signal and the second intermediate signal, wherein the first and second intermediate signals are combined in an RF output signal;

wherein the first vector generator and the second vector generator individually comprise a first quadrant select in parallel with a second quadrant select and a first variable gain amplifier in parallel with a second variable gain amplifier.

10. The phased array antenna of claim 9, wherein the combiner is an active combiner.

11. The phased array antenna of claim 9, wherein the combiner is a passive combiner, and wherein the passive combiner is a Wilkinson combiner.

12. A phased array antenna in communication with a radiating element, the phased array antenna comprising:
- a hybrid configured to receive dual linearly polarized RF signals from the radiating element, wherein the hybrid is configured to inject a phase shift and generate a RHCP intermediate signal and a LHCP intermediate signal;
- a first vector generator configured to receive the RHCP intermediate signal, wherein the first vector generator is configured to phase adjust the RHCP intermediate signal for beam steering and output a first RF intermediate signal;
- a second vector generator configured to receive the LHCP intermediate signal, wherein the second vector generator is configured to phase adjust the LHCP intermediate signal for beam steering and output a second RF intermediate signal; and
- a combiner configured to receive the first RF intermediate signal and the second RF intermediate signal, wherein the first and second RF intermediate signals are combined in an RF output signal;
- wherein the first vector generator and the second vector generator individually comprise a first quadrant select in parallel with a second quadrant select and a first variable gain amplifier in parallel with a second variable gain amplifier.

13. The phased array antenna of claim 12, wherein the hybrid is a 90° active hybrid configured to inject a 90° phase shift.

14. The phased array antenna of claim 12, wherein the hybrid is a 180° active hybrid configured to inject a 180° phase shift.

15. The phased array antenna of claim 12, wherein the hybrid is either a 90° passive hybrid or a 180° passive hybrid.

16. The phased array antenna of claim 12, wherein the combiner is an active combiner.

17. The phased array antenna of claim 12, wherein the combiner is a passive combiner, wherein the passive combiner is a Wilkinson combiner.

18. A phased array antenna in communication with a radiating element, the phased array antenna comprising:
- a hybrid configured to receive dual linearly polarized RF signals from the radiating element, wherein the hybrid is configured to inject a phase shift and generate a RHCP intermediate signal and a LHCP intermediate signal;
- a first vector generator configured to receive the RHCP intermediate signal, wherein the first vector generator is configured to phase adjust the RHCP intermediate signal for beam steering and output a first RF intermediate signal;
- a second vector generator configured to receive the LHCP intermediate signal, wherein the second vector generator is configured to phase adjust the LHCP intermediate signal for beam steering and output a second RF intermediate signal; and
- an output hybrid configured to receive the first RF intermediate signal and the second RF intermediate signal and generate two RF output signals with a phase difference, wherein the two RF output signals are a composite of the first and second RF intermediate signals;
- wherein the first vector generator and the second vector generator individually comprise a first quadrant select in parallel with a second quadrant select and a first variable gain amplifier in parallel with a second variable gain amplifier.

19. The phased array antenna of claim 18, wherein the hybrid is a 90° active hybrid or a 180° active hybrid.

20. The phased array antenna of claim 18, wherein the hybrid is either a 90° passive hybrid or a 180° passive hybrid.

21. The phased array antenna of claim 18, wherein the output hybrid is a 90° active hybrid or a 180° active hybrid.

22. The phased array antenna of claim 18, wherein the output hybrid is either a 90° passive hybrid or a 180° passive hybrid.

* * * * *